United States Patent
Honma

(10) Patent No.: US 10,094,022 B2
(45) Date of Patent: Oct. 9, 2018

(54) SUBSTRATE PROCESSING APPARATUS AND METHOD OF FABRICATING SUBSTRATE LOADING UNIT

(71) Applicant: TOKYO ELECTRON LIMITED, Tokyo (JP)

(72) Inventor: Manabu Honma, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 310 days.

(21) Appl. No.: 14/854,066

(22) Filed: Sep. 15, 2015

(65) Prior Publication Data

US 2016/0083841 A1    Mar. 24, 2016

(30) Foreign Application Priority Data

Sep. 24, 2014 (JP) ................... 2014-194180

(51) Int. Cl.
| | |
|---|---|
| C23C 16/458 | (2006.01) |
| H01L 21/683 | (2006.01) |
| H01L 21/687 | (2006.01) |
| C23C 16/455 | (2006.01) |

(52) U.S. Cl.
CPC ...... *C23C 16/4581* (2013.01); *C23C 16/4584* (2013.01); *C23C 16/45551* (2013.01); *H01L 21/68792* (2013.01)

(58) Field of Classification Search
CPC ... F16D 1/09; F16D 1/06; F16D 1/093; F16B 17/00; Y10T 403/7032; Y10T 403/7061; F16F 15/1201

USPC .......... 24/453, 141; 156/345.23; 204/298.01; 279/141
See application file for complete search history.

(56) References Cited

U.S. PATENT DOCUMENTS

| | | | | |
|---|---|---|---|---|
| 3,636,916 A * | 1/1972 | Thelen | ................. | C23C 14/548 118/690 |
| 6,118,100 A * | 9/2000 | Mailho | .............. | C23C 16/4584 118/728 |
| 8,858,716 B2 * | 10/2014 | Hoshino | ............. | H01L 21/6719 118/719 |

(Continued)

FOREIGN PATENT DOCUMENTS

JP    2010-084230 A    4/2010

*Primary Examiner* — Rakesh K Dhingra
*Assistant Examiner* — Laureen Chan
(74) *Attorney, Agent, or Firm* — Nath, Goldberg & Meyer; Jerald L. Meyer

(57) ABSTRACT

A substrate processing apparatus includes a process chamber in which etching by a corrosive gas is performed to remove a film formed therein after a film formation process, a susceptor disposed in the process chamber and having a substrate loading portion, a stationary shaft passing through the susceptor, a first securing member securing the susceptor at an upper side, a second securing member securing the susceptor at a lower side, a pressing member disposed below the susceptor to urge the stationary shaft in a downward direction while urging the second securing member in an upward direction, and a stopping member formed above the susceptor and engaged with the stationary shaft to urge the first securing member in cooperation with the pressing member. The susceptor, the first securing member and the stopping member are made of a material having corrosion resistance higher than the pressing member.

17 Claims, 21 Drawing Sheets

(56) References Cited

U.S. PATENT DOCUMENTS

| | | | |
|---|---|---|---|
| 2004/0046096 A1* | 3/2004 | Chen | H01L 21/6875 248/346.01 |
| 2009/0155028 A1* | 6/2009 | Boguslavskiy | C23C 16/4581 414/223.01 |
| 2010/0050944 A1* | 3/2010 | Kato | C23C 16/401 118/730 |

* cited by examiner

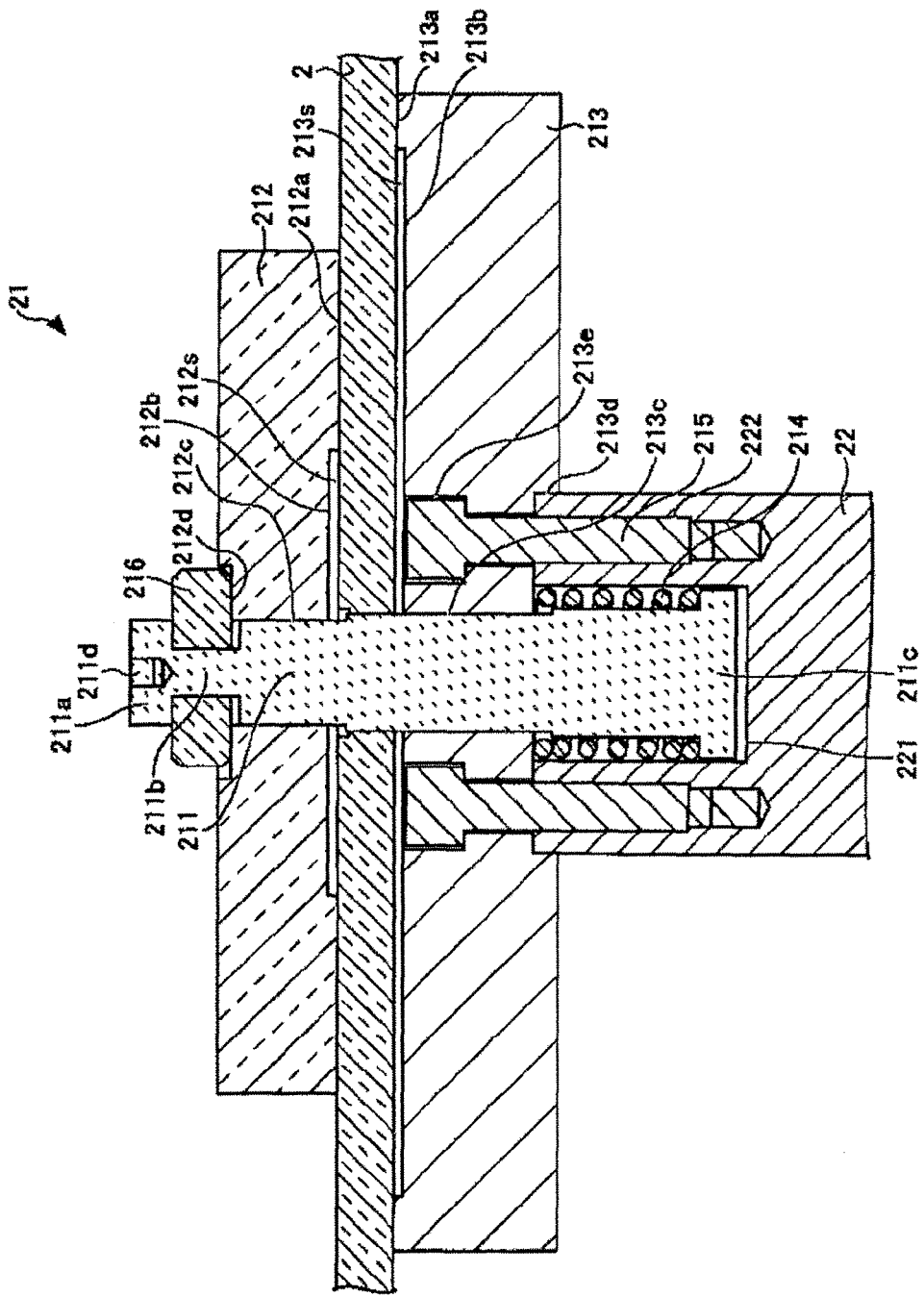

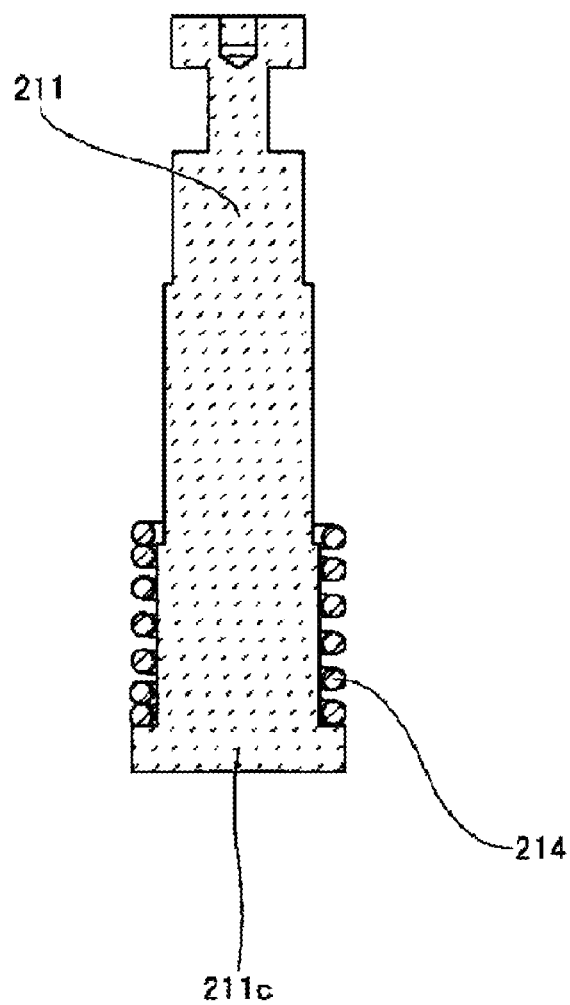

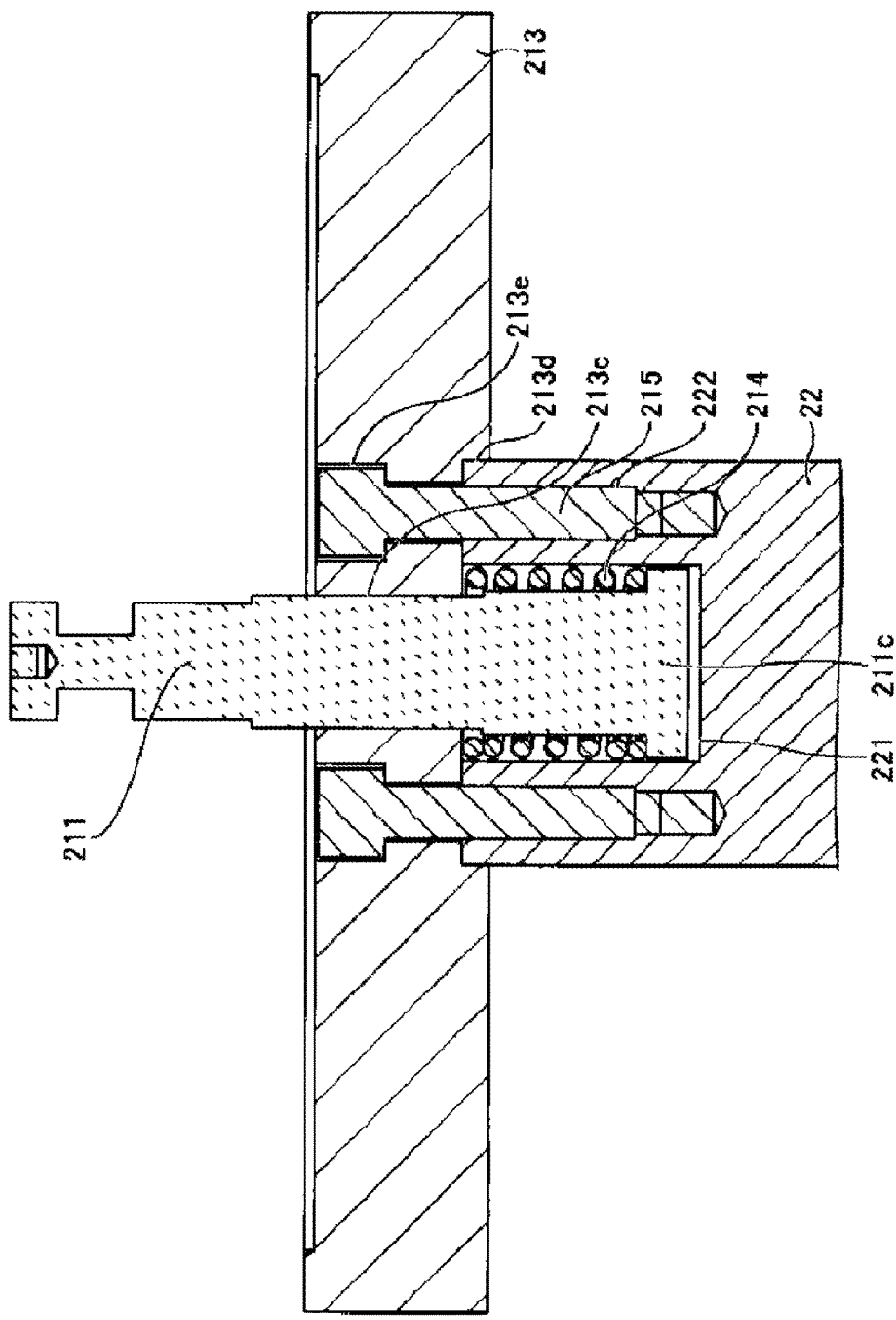

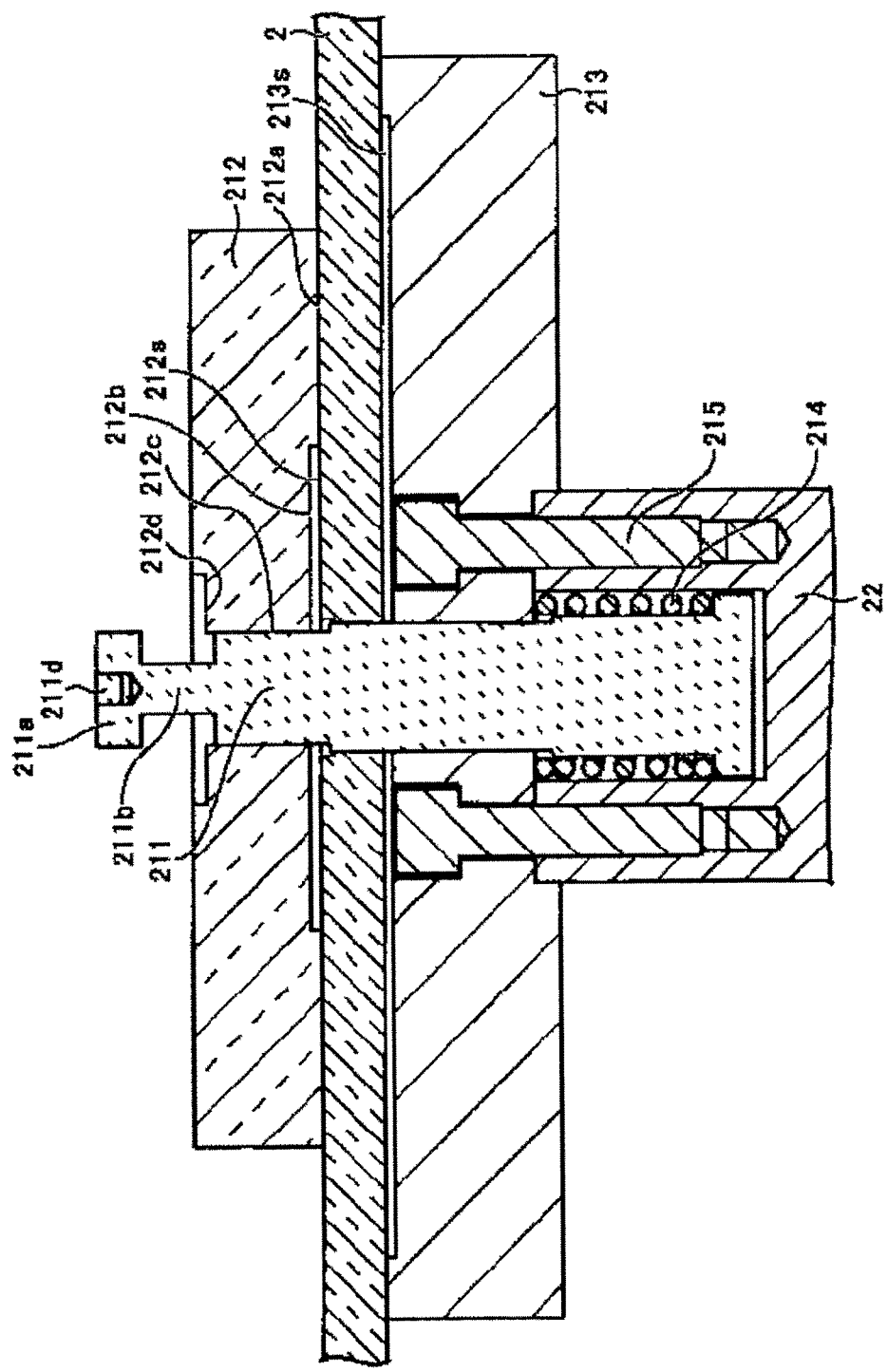

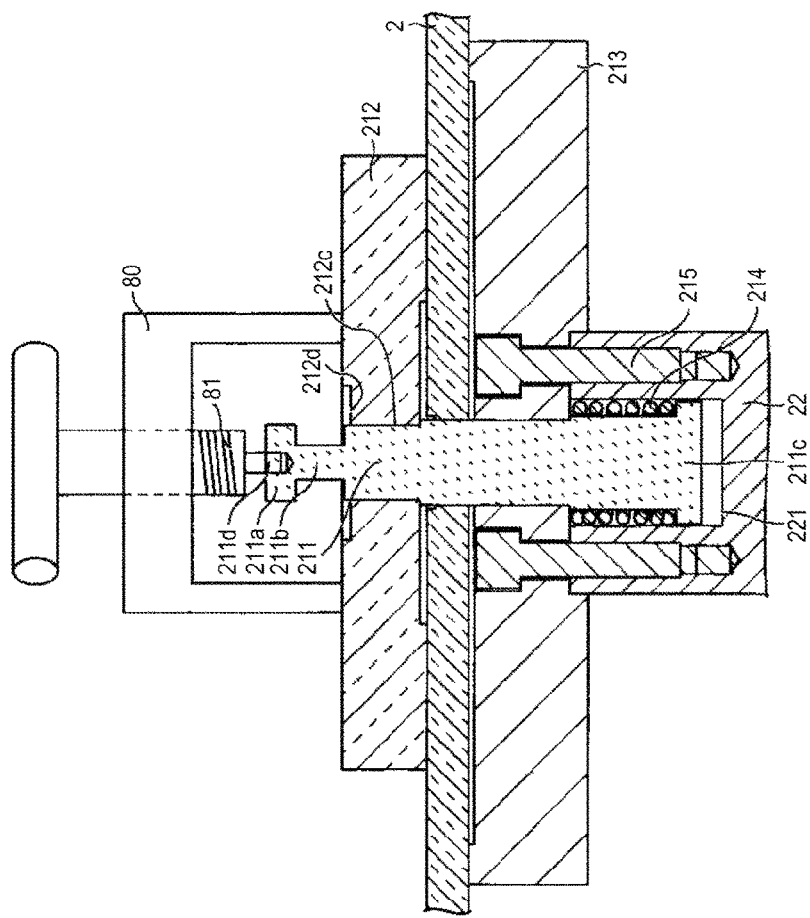

SUBSTRATE PROCESSING APPARATUS AND METHOD OF FABRICATING SUBSTRATE LOADING UNIT

CROSS-REFERENCE TO RELATED APPLICATION

This application claims the benefit of Japanese Patent Application No. 2014-194180, filed on Sep. 24, 2014, in the Japan Patent Office, the disclosure of which is incorporated herein in its entirety by reference.

TECHNICAL FIELD

The present disclosure relates to a substrate processing apparatus and a method of fabricating a substrate loading unit.

BACKGROUND

One of the conventional film formation apparatuses which perform a film formation process on a substrate within a process chamber is provided with a rotatable table on which a substrate is loaded. The rotatable table is maintained in a center region and is interposed between an upper hub and a lower hub. In the film formation apparatus, when six bolts passing through holes formed in the upper hub are screwed into threaded holes formed in the lower hub via disk springs, respectively, the rotatable table is fixed.

However, such a film formation apparatus has a problem in that metal contamination due to the bolts, the disk spring, and the like may occur when etching such as cleaning is performed in a state where the rotatable table is rotated at a high speed of about 240 rpm or more while a substrate is maintained at a temperature of 600 to 700 degrees C. or higher.

Specifically, a high temperature film formation process performed at a high temperature of 600 to 700 degrees C. or higher has been used in recent years. After the high temperature film formation process is performed for a predetermined period or a predetermined number of times, the process chamber is regularly subjected to cleaning. At this moment, the cleaning is performed under a temperature slightly lowered from the film formation temperature without changing the revolutions per minute (RPM). The cleaning is performed using a corrosive gas used in etching. In such a high temperature etching process, the rotatable table made of a non-corrosive material such as quartz suffers from less contamination, whereas metal contamination can occur due to the bolts, the disk spring, and the like, which are made of metal.

SUMMARY

Some embodiments of the present disclosure provide a substrate processing apparatus in which metal contamination or the like is difficult to occur even in a high temperature process, and a method of fabricating a substrate loading unit.

According to the present disclosure, provided is a substrate processing apparatus including: a process chamber in which etching by a supplied corrosive gas can be performed to remove a film formed therein after a film formation process; a susceptor disposed in the process chamber and having a substrate loading portion on which a substrate can be loaded on an upper surface of the susceptor, the corrosive gas being supplied to the susceptor from above the upper surface of the susceptor; a stationary shaft passing through the susceptor; a first securing member configured to secure the susceptor at an upper surface side with the stationary shaft inserted into the first securing member; a second securing member configured to secure the susceptor at a lower surface side with the stationary shaft inserted into the second securing member; a pressing member disposed below the susceptor to urge the stationary shaft in a downward direction while urging the second securing member in an upward direction, thereby securing the susceptor at the lower surface side through the second securing member; and a stopping member formed above the susceptor and engaged with the stationary shaft to urge the first securing member in cooperation with the pressing member, thereby securing the susceptor at the upper surface side through the first securing member, wherein the susceptor, the first securing member and the stopping member are made of a material having corrosion resistance against the corrosive gas higher than the pressing member.

According to the present disclosure, provided is a method of fabricating a substrate loading unit, including: placing a spring around a stationary shaft having a spring support portion formed at a lower end of the stationary shaft to protrude in a radial direction and a constricted portion formed at an upper end of the stationary shaft and having a smaller diameter than the upper end of the stationary shaft, to place the spring on the spring support portion; preparing a support shaft having a stationary shaft receiving space formed at an upper end of the support shaft and being capable of accommodating a lower end of the stationary shaft with the spring mounted thereon, and a screw hole formed around the stationary shaft receiving space, and inserting the lower end of the stationary shaft into the stationary shaft receiving space of the support shaft; securing a first securing member on the upper surface of the support shaft using a screw engageable into the screw hole of the support shaft such that the stationary shaft is inserted into the first securing member, the first securing member having a through-hole with a smaller diameter than the diameter of a head of the screw and a first center hole into which the stationary shaft is fitted; placing a susceptor on the first securing member such that the stationary shaft is inserted into the susceptor, the susceptor having a second center hole into which the stationary shaft is fitted; placing a second securing member on the susceptor such that the stationary shaft is inserted into the second securing member, the second securing member having a third center hole into which the stationary shaft is fitted; and lifting the stationary shaft against an urging force of the spring until the constricted portion is exposed above the second securing member, engaging a stopping member around the constricted portion, whereby the susceptor is interposed between the first securing member and the second securing member and secured by a force securing the susceptor interposed between the first securing member and the second securing member through cooperation of an urging force of the spring and the stopping member.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 11A to 11C show temperature distribution and stress distribution of a stationary shaft of the substrate processing apparatus according to the embodiment of the present disclosure.

FIGS. 13A to 13C show cross-sectional views illustrating a series of processes of a method of fabricating a substrate loading unit according to one embodiment of the present disclosure.

FIGS. 14A to 14C show cross-sectional views illustrating a series of processes of one example of the method of fabricating a substrate loading unit according to the embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Processing Apparatus>

Figure 1:
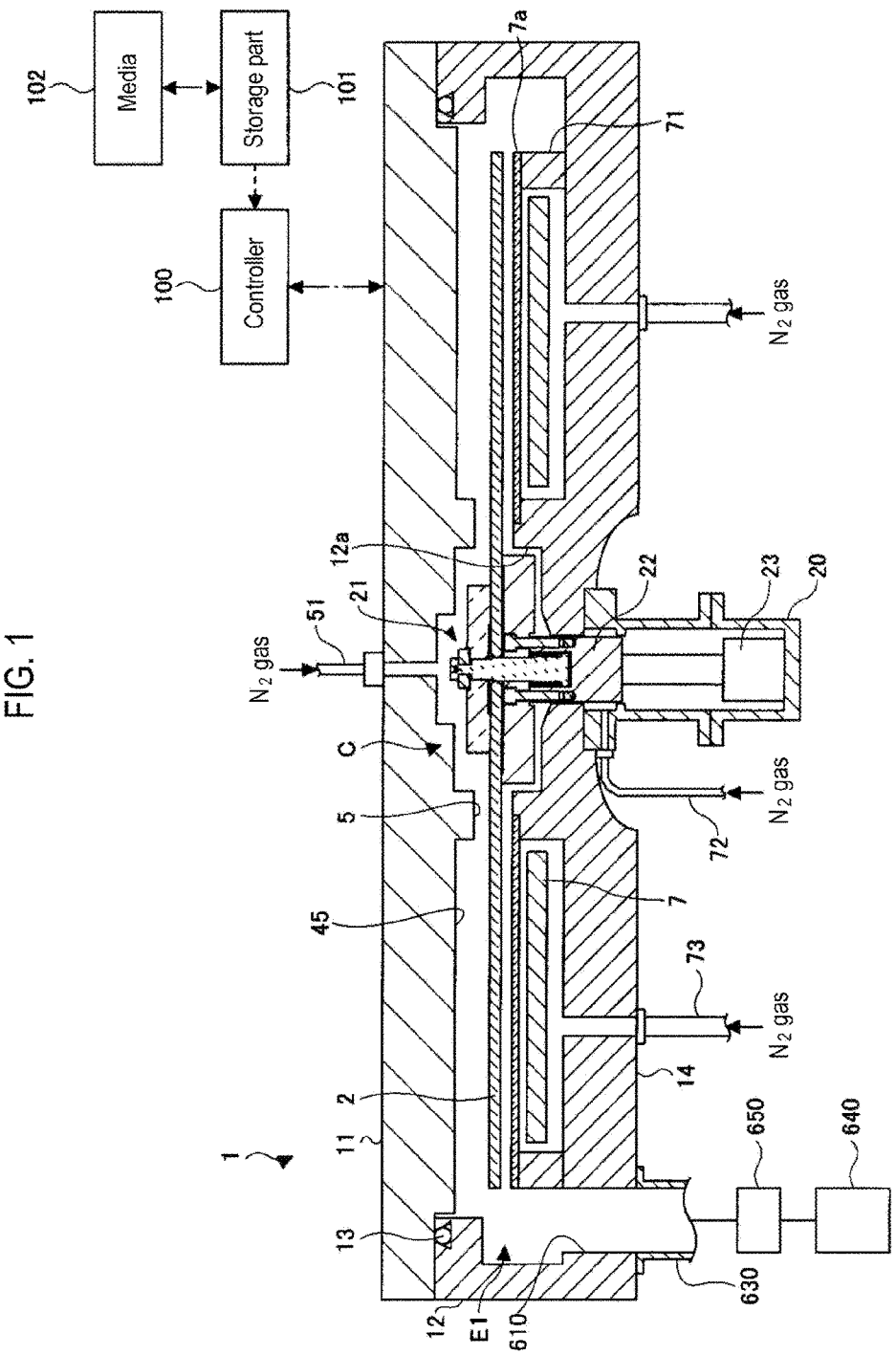
FIG. 1 is a schematic cross-sectional view of one example of an overall configuration of a substrate processing apparatus according to one embodiment of the present disclosure.
Figure 2:
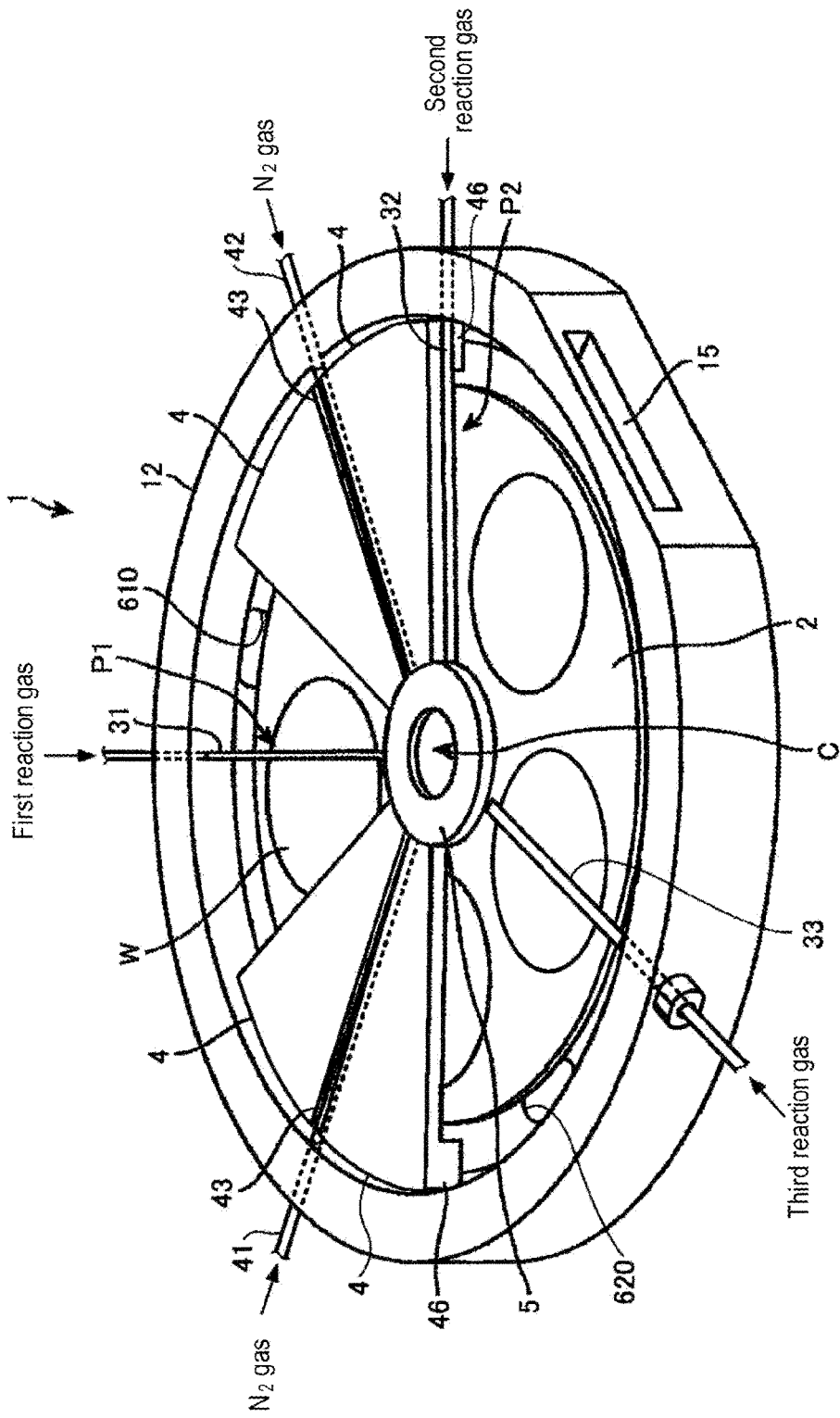
FIG. 2 is a perspective view of the substrate processing apparatus of FIG. 1.
Figure 3:
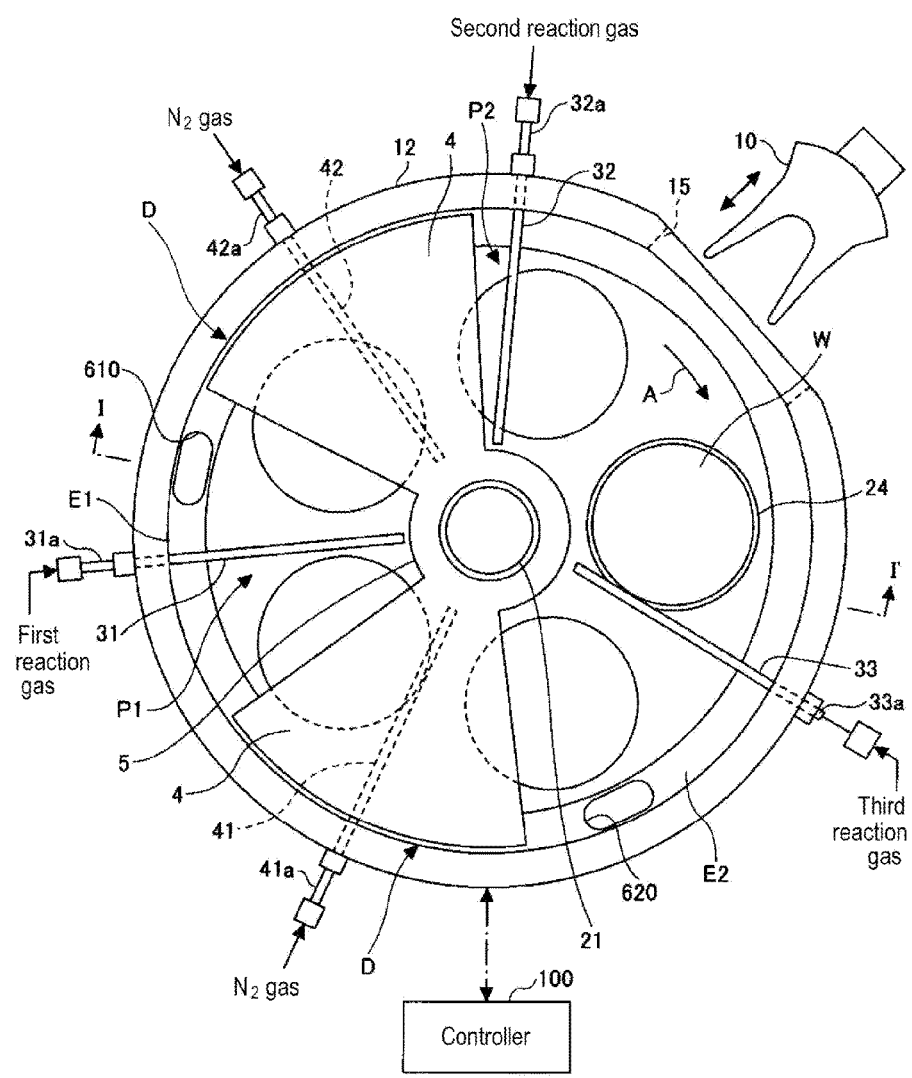
FIG. 3 is a schematic top view of the substrate processing apparatus of FIG. 1, showing an inner configuration of a process chamber.

First, the overall configuration of a substrate processing apparatus according to the embodiment of the present disclosure will be described. Referring to FIG. 1 to FIG. 3, the substrate processing apparatus according to the embodiment of the present disclosure includes a flat process chamber 1 having a substantially circular planar shape, and a susceptor 2 disposed within the process chamber 1 and having a center of rotation at the center of the process chamber 1. The process chamber 1 includes a container body 12 having a cylindrical shape with a bottom, and a ceiling plate 11 detachably placed on an upper surface of the container body 12 and forming a hermetic seal via a sealing member 13 (see FIG. 1), for example, an O-ring.

The susceptor 2 is secured at a central portion thereof to a core part 21. The core part 21 is secured to an upper end of a rotational shaft 22 extending in the vertical direction. It should be noted that the substrate processing apparatus according to the present disclosure is not necessarily provided with the rotational shaft 22 and, instead, may include a post configured to support the core part 21 without rotational movement. In this embodiment, the substrate processing apparatus will be described as including the rotational shaft 22 configured to support the core part 21 by way of example. Detailed configuration of the core part 21 is given below. The rotational shaft 22 passes through a bottom portion 14 of the process chamber 1 and is connected at a lower end thereof to a driving part 23 which rotates the rotational shaft 22 (FIG. 1) about a vertical axis. The rotational shaft 22 and the driving part 23 are received within a cylindrical case body 20, which is open at an upper side thereof. Since a flange formed at an upper surface of the case body 20 is air-tightly coupled to a lower surface of the bottom portion 14 of the process chamber 1, an air-tight state is maintained between an inner atmosphere and an outer atmosphere of the case body 20.

Referring to FIG. 2 and FIG. 3, a surface of the susceptor 2 includes circular recesses 24 formed along a rotational (circumferential) direction. On the recesses, a plurality of semiconductor wafers W (hereinafter, referred to as the "wafer"; five wafers shown in this example) is loaded. For convenience of description, the wafer W is only indicated on a single recess 24 in FIG. 3. The recess 24 has an inner diameter which is slightly greater than the diameter of the wafer W by, for example, about 4 mm, and a depth which is substantially the same as the thickness of the wafer W. Thus, when the wafer W is received in the recess 24, the surface of the wafer W is flush with an upper surface of the susceptor 2 (a region on which the wafer W is not loaded). A lower surface of the recess 24 includes through-holes (not shown) formed therethrough. For example, three lifting pins which support a rear surface of the wafer W to raise or lower the wafer W pass the through holes.

Although the susceptor 2 can be made of various materials, the susceptor 2 is advantageously made of a material which exhibits high corrosion resistance with respect to a corrosive gas used in etching or cleaning and high heat resistance for the use in a high temperature environment. Accordingly, the susceptor 2 is made of, for example, quartz, carbon, SiC, and the like.

FIG. 2 and FIG. 3 show the internal structure of the process chamber 1, in which the ceiling plate 11 is not shown for convenience of description. As shown in FIG. 2 and FIG. 3, above the susceptor 2 in the process chamber 1, a reaction gas nozzle 31, a reaction gas nozzle 32, a reaction gas nozzle 33 and dividing gas nozzles 41, 42, which are made of, e.g., quartz, are arranged at certain intervals in the circumferential direction of the process chamber 1 (the rotational direction of the susceptor 2 (indicated by arrow A of FIG. 3)). In the shown embodiment, the reaction gas nozzle 33, the dividing gas nozzle 41, the reaction gas nozzle 31, the dividing gas nozzle 42 and the reaction gas nozzle 32 are arranged in this order in the clockwise direction (rotational direction of the susceptor 2) from a transfer gate 15 described below. These nozzles 31, 32, 33, 41, 42 are introduced into the process chamber 1 through an outer circumferential wall of the process chamber 1 by securing gas feeding ports 31a, 32a, 33a, 41a, 42a (FIG. 3) which correspond to proximal ends of the nozzles 31, 32, 33, 41, 42, respectively, to an outer circumferential wall of the container body 12. The nozzles 31, 32, 33, 41, 42 are installed such that they horizontally extend in parallel relationship with the susceptor 2 in a radial direction of the container body 12.

In this embodiment, the reaction gas nozzle 31 is connected to a supply source (not shown) of a first reaction gas though a conduit and a flow controller (not shown). The reaction gas nozzle 32 is connected to a supply source (not shown) of a second reaction gas though a conduit and a flow controller (not shown). In addition, the reaction gas nozzle 33 is connected to a supply source (not shown) of a third reaction gas though a conduit and a flow controller (not shown). All of the dividing gas nozzles 41, 42 are connected to a supply source (not shown) of dividing gas through conduits and flow controllers (not shown). The dividing gas may include a noble gas such as helium (He) or argon (Ar) gas, or an inert gas such as nitrogen ($N_2$) gas. In this embodiment, $N_2$ is used.

Further, although the process chamber 1 is illustrated as including three reaction gas nozzles 31 to 33 in FIG. 2 and FIG. 3, it should be understood that the process chamber 1 may be provided with two reaction gas nozzles when two types of reaction gases are supplied. For example, the process chamber 1 may only include the reaction gas nozzles 31, 32. Alternatively, when more than three types of reaction gases are supplied, the process chamber may be provided with four or more reaction gas nozzles. The number of reaction gas nozzles may be suitably determined depending upon the kind or purpose of the process to be performed.

The reaction gas nozzles 31 to 33 are provided with a plurality of gas ejection holes 35, which are open towards the susceptor 2 and arranged at an interval of, for example, 10 mm, in a longitudinal direction of the reaction gas nozzles 31 to 33. A region below the reaction gas nozzle 31 becomes a first process region P1 in which the first reaction gas is adsorbed onto the wafer W. A region below the reaction gas nozzle 32 becomes a second process region P2 in which the second reaction gas is allowed to react with the first reaction gas adsorbed onto the wafer W in the first process region P1. Further, the reaction gas nozzle 33 is also included in the second process region P2, so that a third reaction gas can be allowed to react with a reaction product of the first reaction gas and the second reaction gas, or a third reaction gas can be allowed to react with the first reaction gas adsorbed on the wafer W by being supplied through the reaction gas nozzle 33 after stopping supply of the second reaction gas through the reaction gas nozzle 32.

The first reaction gas, the second reaction gas, and the third reaction gas are suitably determined depending on a process to be performed. For example, the first reaction gas supplied from the reaction gas nozzle 31 may be $TiCl_4$, the second reaction gas supplied from the reaction gas nozzle 32 may be a nitriding gas such as $NH_3$ and the like, and the third reaction gas supplied from the reaction gas nozzle 33 may be an oxidizing gas such as $O_2$ gas, $O_3$ gas, and the like.

Further, film formation gases are supplied from the reaction gas nozzles 31 to 33 when performing the film formation on the wafer W, whereas corrosive gases for etching are supplied from the reaction gas nozzles 31 to 33 when etching a layer formed on the wafer W or when etching or cleaning an unnecessary film within the process chamber 1. Examples of the reaction gas for etching may include fluorine gas such as $ClF_3$, $F_2/HF$, and the like. As the etching gas, a suitable gas can be selected based on the purpose that the gas will be used, for example, etching a layer formed on the wafer W, removal of an unnecessary film formed within the process chamber 1 during the film formation, and the like.

Referring to FIG. 2 and FIG. 3, two convex structures 4 are formed within the process chamber 1. Since the convex structures 4 define dividing regions D together with the dividing gas nozzles 41, 42, the convex structures 4 are formed on the rear surface of the ceiling plate 11 to protrude towards the susceptor 2, as described below. Further, a top portion of the convex structure 4 has a fan-like planar shape cut into a circular sector. In the present embodiment, an inner circular arc of the convex structure 4 is connected to a protrusion 5 (described below) and an outer circular arc is disposed along an inner peripheral surface of the container body 12 of the process chamber 1.

Figure 4:
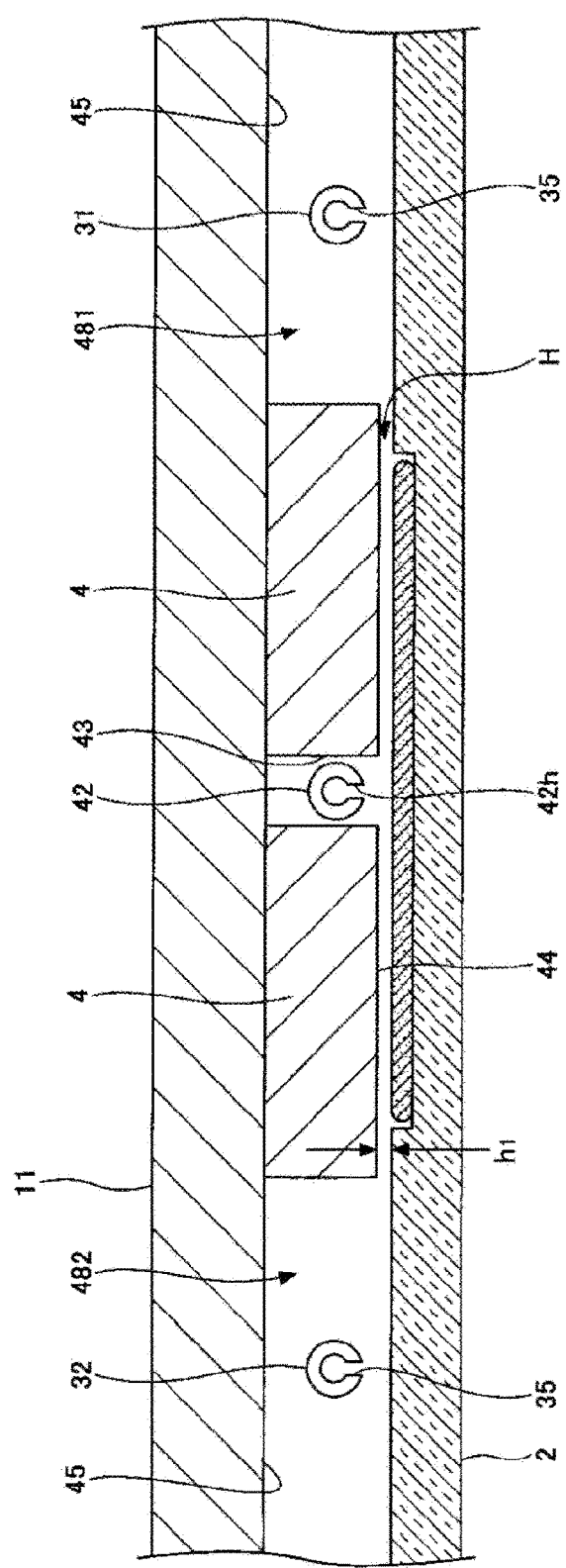
FIG. 4 is a schematic cross-sectional view of the substrate processing apparatus of FIG. 1 when taken along a concentric circle of a susceptor rotatably disposed within the process chamber.

FIG. 4 is a cross-sectional view of the process chamber 1 when taken along a concentric circle of the susceptor 2 from the reaction gas nozzle 31 to the reaction gas nozzle 32. As shown, since the convex structures 4 are formed on the rear surface of the ceiling plate 11, a flat lower ceiling plane 44 (first ceiling plane) which is a lower surface of the convex structure 4, and a higher ceiling plane 45 (second ceiling plane) which is placed at both sides of the ceiling plane 44 in the circumferential direction and is higher than the ceiling plane 44, exist in the process chamber 1. A top portion of the ceiling plane 44 has a fan-like planar shape cut into a circular sector. In addition, referring to FIG. 4, one of the convex structures 4 includes a groove 43 formed in the middle of the convex structure 4 in the circumferential direction and extending in the radial direction such that it can receive the dividing gas nozzle 42 therein. The other convex structure 4 is also formed to have a groove 43 in which the dividing gas nozzle 41 is received. Further, each of the reaction gas nozzles 31, 32 is placed in a space below the higher ceiling plane 45. The reaction gas nozzles 31, 32 are spaced apart from the ceiling plane 45 to be placed near the wafer W. Further, as shown in FIG. 4, the reaction gas nozzle 31 is placed in a right side space 481 below the higher ceiling plane 45 and the reaction gas nozzle 32 is placed in a left side space 482 below the higher ceiling plane 45.

Further, each of the dividing gas nozzles 41, 42 received in the grooves 43 of the convex structures 4 has a plurality of gas ejection holes 42h (see FIG. 4) which are open towards the susceptor 2 and arranged at an interval of, for example, 10 mm, in a longitudinal direction of the dividing gas nozzles 41, 42.

The ceiling plane 44 defines a narrow dividing space H together with the susceptor 2. When $N_2$ gas is supplied through the ejection holes 42h of the dividing gas nozzle 42, the $N_2$ gas flows towards the space 481 and the space 482 through the dividing space H. Herein, since the dividing space H has a smaller volume than the spaces 481, 482, the pressure of the dividing space H can be made higher than the pressures of the spaces 481, 482 by the $N_2$ gas. That is, the dividing space H having a high pressure is formed between the spaces 481, 482. In addition, an $N_2$ gas flowing from the dividing space H into the spaces 481, 482 acts like a counter flow with respect to the first reaction gas supplied from the first process region P1 and the second reaction gas supplied from the second region P2. Accordingly, the first reaction gas from the first process region P1 and the second reaction gas from the second region P2 are separated from each other by the dividing space H. Accordingly, the first reaction gas and the second reaction gas are prevented from mixing and reacting with each other within the process chamber 1.

Further, a height h1 of the ceiling plane 44 from an upper surface of the susceptor 2 is suitably determined such that a pressure in the dividing space H becomes higher than those of the spaces 481, 482, by taking into account an inner pressure of the process chamber 1, a rotational speed of the susceptor 2, a supply amount of the dividing gas ($N_2$ gas), and the like during the film formation process.

On the other hand, a protrusion 5 (FIG. 2 and FIG. 3) which surrounds an outer periphery of the core part 21 securing the susceptor 2 is formed on the lower surface of the ceiling plate 11. In this embodiment, the protrusion 5 is connected to a rotational center portion of the convex structure 4 and has a lower surface flush with the ceiling plane 44.

Figure 5:
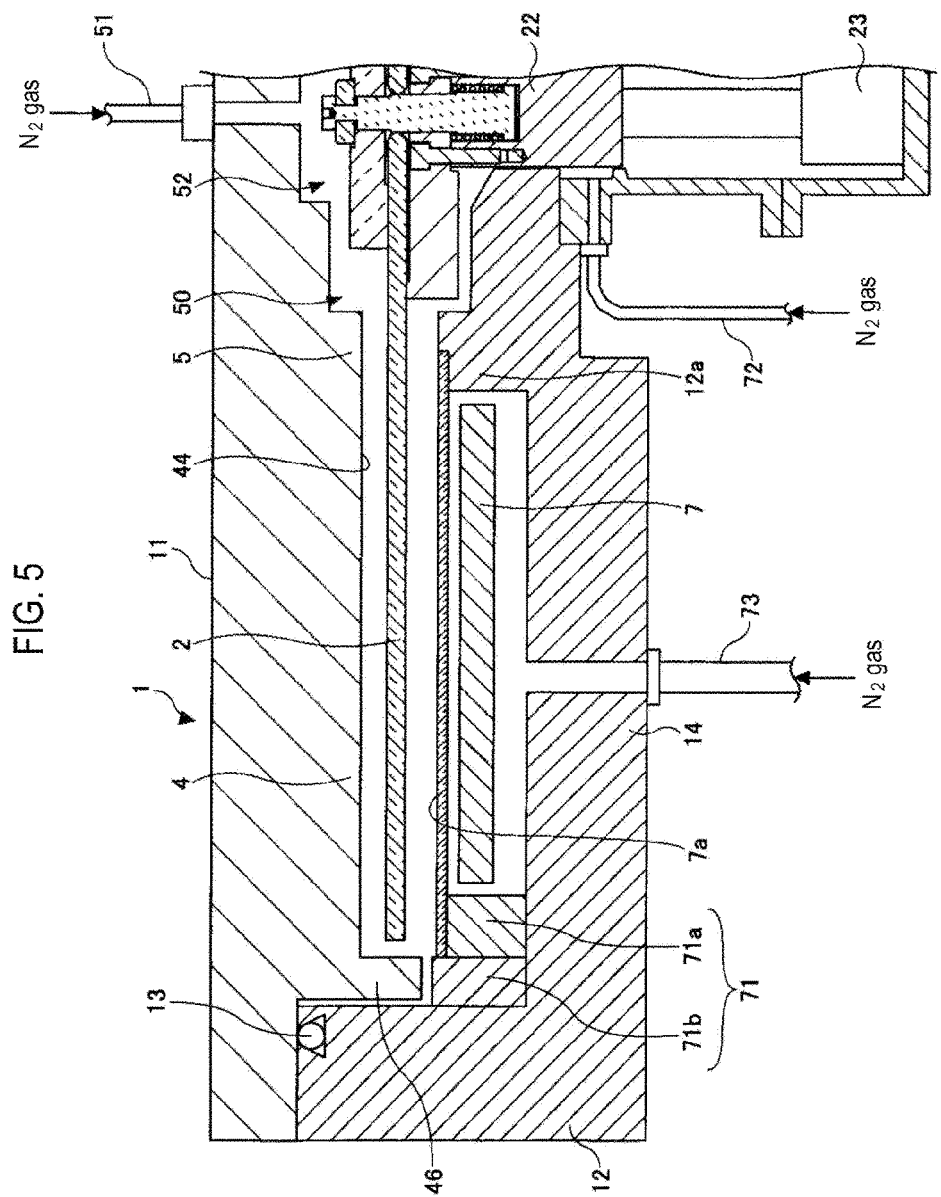
FIG. 5 is another schematic cross-sectional view of the substrate processing apparatus of FIG. 1.

FIG. 1 is a cross-sectional view taken along the line I-I' of FIG. 3 and shows a region in which the ceiling plane 45 is formed. FIG. 5 is a cross-sectional view of the region in which the ceiling plane 44 is formed. As shown in FIG. 5, a periphery portion of each of the fan-shaped convex structure 4 (the outer periphery of the process chamber 1) includes an L-shaped bent section 46, which is bent to face a lateral end surface of the susceptor 2. Like the convex structure 4, the bent section 46 suppresses intrusion of the reaction gas from both sides of the dividing region D, thereby preventing the reaction gas at both sides from mixing with each other. Since the fan-shaped convex structure 4 are formed on the ceiling plate 11 and the ceiling plate 11 can be disassembled from the container body 12, a slight gap exists between an outer peripheral surface of the bent section 46 and the container body 12. A gap between an inner peripheral surface of the bent section 46 and the lateral end surface of the susceptor 2 and the gap between the outer peripheral surface of the bent section 46 and the container body 12 are set to be equal to, e.g., the height of the ceiling plane 44 from the upper surface of the susceptor 2.

An inner peripheral wall of the container body 12 is in a form of a vertical surface near the outer peripheral surface of the bent section 46 in the dividing region D, as shown in FIG. 5. However, it is radially outwardly depressed, for example, from a portion facing the lateral end surface of the susceptor 2 to the bottom 14, in regions other than the dividing region D, as shown in FIG. 1. Hereinafter, for convenience of description, a depressed portion having a substantially rectangular cross-section will be referred to as an exhaust region. Specifically, an exhaust region communicating with the first process region P1 is referred to as a first exhaust region E1, and an exhaust region communicating with the second process region P2 is referred to as a second exhaust region E2. A first exhaust port 610 and a second exhaust port 620 are formed on bottoms of the first exhaust region E1 and the second exhaust region E2, respectively, as shown in FIG. 1 to FIG. 3. The first exhaust port 610 and the second exhaust port 620 are connected to an exhaust device, for example, a vacuum pump 640, via an exhaust pipe 630, as shown in FIG. 1. In addition, a pressure regulator 650 is disposed between the vacuum pump 640 and the exhaust pipe 630.

As shown in FIG. 1 and FIG. 5, a heater part 7 that is a heating means is disposed in a space between the susceptor 2 and the bottom 14 of the process chamber 1, and the wafer W placed on the susceptor 2 is heated to a certain temperature (for example, 700 degrees C.) set according to a process recipe. Ring-shaped cover members 71 are disposed at a lower side near the periphery of the susceptor 2 in order to prevent intrusion of gas into a lower space of the susceptor 2 by separating an atmosphere from an upper space of the susceptor 2 to the exhaust regions E1, E2, from an atmosphere in which the heater part 7 is placed (see FIG. 5). The cover members 71 include an inner member 71a disposed at the lower side to face the periphery of the susceptor 2 and a section positioned radially outward than the periphery of the susceptor 2, and an outer member 71b disposed between the inner member 71a and an inner wall of the process chamber 1. The outer member 71b is placed near the bent section 46 formed on the periphery of the convex structure 4 at a position below the bent section 46 in the dividing region D, and the inner member 71a surrounds the entire circumference of the heater part 7 below the periphery of the susceptor 2 (and below the section positioned slightly radially outward than the periphery of the susceptor).

At a portion further biased towards the rotational center than a space in which the heater part 7 is disposed, the bottom 14 protrudes to form a protrusion 12a which is placed near the core part 21 at the center of a lower surface of the susceptor 2. A narrow space is defined between the protrusion 12a and the core part 21, and a narrow gap is formed between the rotational shaft 22 and an inner circumferential surface of the through-hole of the bottom 14 through which the rotational shaft 22 passes, wherein these narrow spaces communicate with the case body 20. In addition, the case body 20 is provided with a purge gas supply tube 72 through which a purge gas such as an $N_2$ gas is supplied into the narrow spaces to purge the spaces. Further, the bottom 14 of the process chamber 1 is provided with a plurality of purge gas supply tubes 73 arranged at certain angular intervals below the heater part 7 in the circumferential direction and purging a heater installation space in which the heater part 7 is disposed (only a single purge gas supply tube 73 is shown in FIG. 5). Further, a lid member 7a is disposed between the heater part 7 and the susceptor 2 and covers a space between an inner circumferential wall of the outer member 71b (upper surface of the inner member 71a) and an upper end of the protrusion 12a in the circumferential direction to prevent intrusion of gas into the heater installation space. The lid member 7a may be made of, for example, quartz.

Further, a dividing gas supply tube 51 is connected to the center of the ceiling plate 11 of the process chamber 1 and is configured to supply $N_2$ gas as a dividing gas to a space 52 between the ceiling plate 11 and the core part 21. The dividing gas supplied to the space 52 is ejected towards the periphery of the susceptor 2 along a surface of a wafer loading region on the susceptor 2 through a narrow space 50 between the protrusion 5 and the susceptor 2. The space 50 may be maintained at a higher pressure than the space 481 and the space 482 by the dividing gas. Accordingly, the space 50 prevents $TiCl_4$ gas supplied to the first process region P1 and $NH_3$ gas supplied to the second process region P2 from passing a central region C and mixing with each other. That is, the space 50 (or the central region C) can act like the dividing space H (or the dividing region D).

Further, as shown in FIG. 2 and FIG. 3, a transfer gate 15 through which a wafer W is transferred between the susceptor 2 and an outside transfer arm 10 is formed through a sidewall of the process chamber 1. The transfer gate 15 is opened or closed by a gate valve (not shown). Further, when the recess 24 of the susceptor 2 that is the wafer loading region stays at a place facing the transfer gate 15, the transfer of the wafer W between the recess 24 and the transfer arm 10 is performed. For the transfer, a lift pin and a lift mechanism (not shown) configured to upwardly lift the wafer W from the rear surface thereof are disposed through the recess 24 at a location below the susceptor 2 corresponding to the wafer transfer position of the susceptor 2.

In addition, as shown in FIG. 1, the film formation apparatus according to this embodiment is provided with a controller 100 implemented by a computer for controlling overall operation of the film formation apparatus. Further, programs for performing a film formation method in the film formation apparatus under control of the controller 100 are stored in a memory of the controller 100. These programs include step groups configured to perform the film formation method described below and are stored in a storage medium 102 such as a hard disk, a compact disk, a magneto-optical disk, a memory card, a flexible disk, and the like. These programs are read into a storage part 101 by a predetermined reading device and are installed in the controller 100.

Figure 6:
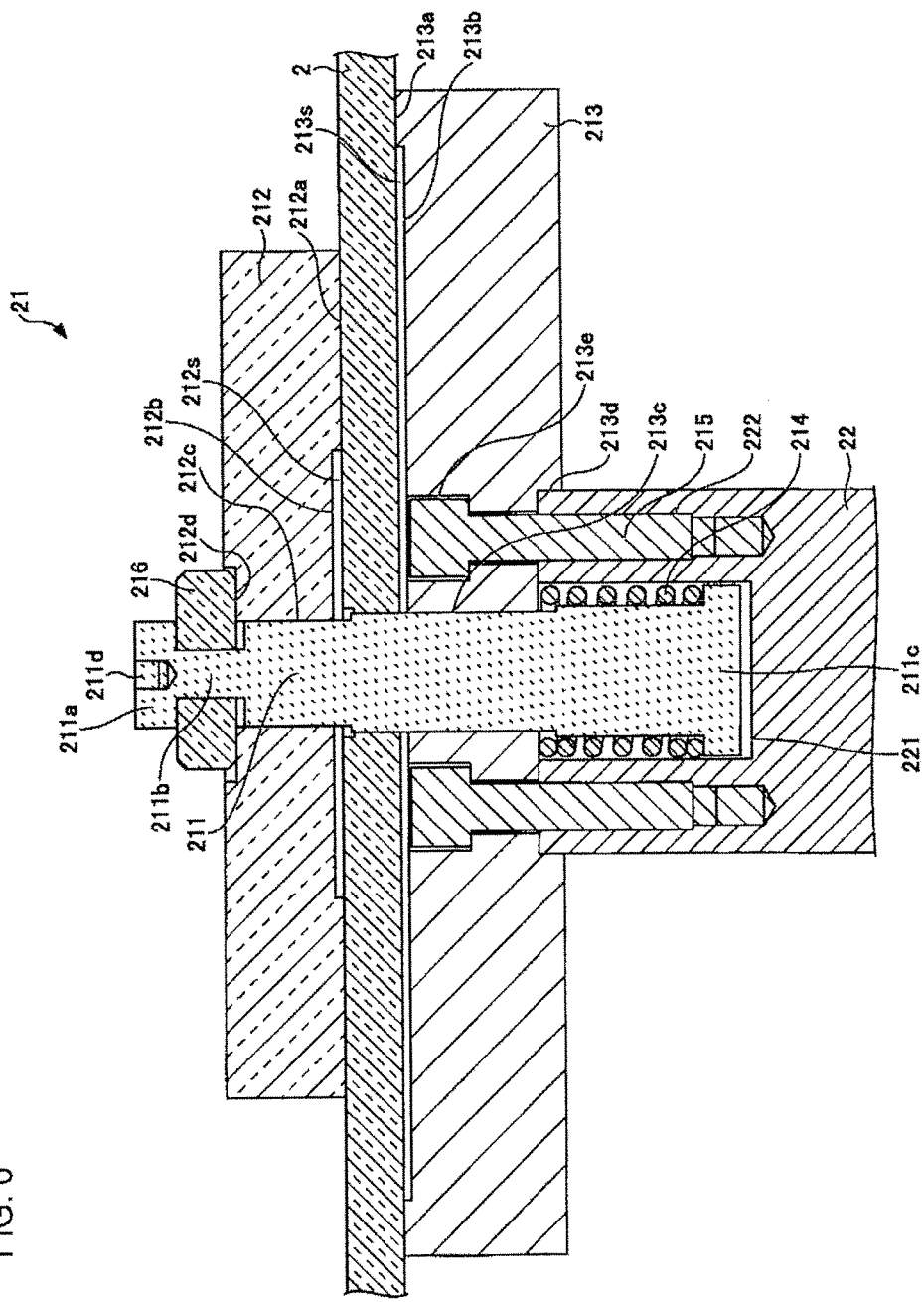
FIG. 6 is a cross-sectional view of a core part of one example of the substrate processing apparatus according to the embodiment of the present disclosure.

Next, the structure of the core part 21 will be described in detail with reference to FIG. 6. FIG. 6 is a sectional view of one example of the core part 21 of the substrate processing apparatus according to the embodiment of the present disclosure.

Referring to FIG. 6, the core part 21 of the substrate processing apparatus according to this embodiment of the present disclosure includes a stationary shaft 211, an upper hub 212, a lower hub 213, a spring 214, a screw 215, and a stopper 216. Further, as described with reference to FIG. 1 and FIG. 4, the core part 21 is secured to the upper end of the rotational shaft 22 in which a stationary shaft receiving region 221 and a screw hole 222 are formed. The core part 21 has a structure for securing the susceptor 2 and is secured to the rotational shaft 22. Accordingly, rotation of the rotational shaft 22 is transferred to the susceptor through the core part 21.

The stationary shaft 211 extends through the stopper 216, the upper hub 212, the susceptor 2, and the lower hub 213 and serves to horizontally position and fix them. In addition, a lower portion of the stationary shaft 211 is received in the stationary shaft receiving region 221 of the rotational shaft 22 to secure the susceptor 2 to the upper end of the rotational shaft 22. The stationary shaft 211 includes a locking portion 211a, a constricted portion 211b, and a spring support portion 211c. The locking portion 211a and the constricted portion 211b constitute a structure for locking the stopper 216, wherein the locking portion 211a has a large diameter and the constricted portion 211b has a diameter smaller than the locking portion 211a. The stopper 216 is engaged around the constricted portion 211b, and the locking portion 211a restricts upward movement of the stopper 216 to secure the stopper 216. In addition, the locking portion 211a is provided to an upper end of the stationary shaft 211 and the constricted portion 211b is placed directly under the locking portion 211a.

The spring support portion 211c is a structure for supporting the spring 214, which is formed by forming a band-shaped step on a radially outward surface of the stationary shaft 211, and has an outer diameter larger than other regions of the stationary shaft 211. The spring support portion 211c is formed at a lower portion of the stationary shaft 211, preferably at a lower end thereof, and forms a step which has a width capable of supporting a lower end of the spring 214. By inserting the stationary shaft 211 into the spring 214 having a substantially cylindrical shape, the lower end of the spring 214 is placed on and supported by the spring support portion 211c.

A top surface of the stationary shaft 211 may have a screw hole 211d, as needed. The screw hole 211d is used to pull up the stationary shaft 211 in fabricating a substrate loading unit including securing the susceptor 2 to the core part 21. Specifically, when securing the susceptor 2, a screw is coupled to the screw hole 211d and the stationary shaft 211 is easily lifted using a jig for pulling up the stationary shaft 211, so that the stopper 216 can be engaged around the constricted portion 211b.

The stationary shaft 211 may be made of various materials, for example, $SiN_4$, as long as the material has corrosion resistance with respect to a corrosive gas that is supplied in cleaning or etching. Further, the comparison of $SiN_4$ with other materials will be described later.

The stationary shaft 211 has an outer diameter corresponding to inner diameters of the upper hub 212, the susceptor 2, the lower hub 213 and the stationary shaft receiving region 221 into which the stationary shaft 211 is inserted, and has a stepped structure fitted into the inner diameter of each of the insertion sections.

The upper hub 212 is an upper securing member configured to secure the susceptor 2 at an upper side of the susceptor 2. The upper hub 212 generally has a cylindrical shape with a low height, or a thick disk shape, and has at a center thereof an opening 212c into which the stationary shaft 211 is inserted. Further, the upper hub 212 has a spot facing 212d formed on an upper surface thereof and the stopper 216 is kept on the spot facing 212d. The spot facing 212d is a depression which is slightly larger than the stopper 216, and is engaged with the stopper 216 to support the stopper 216.

The upper hub 212 has on a lower surface thereof a contact portion 212a securing the susceptor 2 while contacting the susceptor 2, and a non-contact portion 212b which defines a space 212s and does not contact the susceptor 2. The contact portion 212a is formed on a periphery of the lower surface of the upper hub 212 and the non-contact portion 212b is formed at the center thereof. The non-contact portion 212b serves to suppress heat conduction from the susceptor 2 and prevents all of heat from being directly transferred from the susceptor 2 to the stationary shaft 211. That is, due to the non-contact portion 212b, a heat transfer route is narrowed to suppress heat transfer. Further, when the contact portion 212a of the upper hub is limited only to the peripheral portion, the susceptor 2 can be put into a better condition for the horizontal adjustment (uniform load) of the susceptor 2 because the points of the load caused by the engagement of the stopper 216 are radially outwardly shifted, avoiding a state where the load is distributed around the stationary shaft 211 and the distance to the load points is short, thereby making it difficult to horizontally adjust the susceptor 2. This feature will be described in detail later.

The lower hub 213 is a lower side securing member which secures the susceptor 2 at a lower side of the susceptor 2. Like the upper hub 212, the lower hub 213 generally has a cylindrical shape with a low height, or a thick disk shape, and has at a center thereof an opening 213c into which the stationary shaft 211 is inserted. Like the upper hub 212, the lower hub 213 also has on a periphery of an upper surface thereof a contact portion 213a contacting the susceptor 2, and on a region closer to the center of the lower hub than the contact portion 213a a non-contact portion 213b not contacting the susceptor 2. A space 213s is formed between the non-contact portion 213b and a lower surface of the susceptor 2. Since the lower hub 213 has a larger diameter than the upper hub 212 while the contact portion 213a has a narrow area and is only formed near the periphery of the lower hub, the contact portion 213a is placed radially outward than the contact portion 212a of the upper hub 212 and shifts more the load point in a radially outward direction, thereby allowing the susceptor 2 to be stably and horizontally secured. Further, since the contact portion 213a is narrow and the non-contact portion 213b is wide, it is possible to more effectively suppress heat transfer from the susceptor 2.

The lower hub 213 has on the lower surface thereof an engagement portion 213d engageable with an upper surface of the rotational shaft 22. The engagement portion 213d may be in a form of a circular groove engageable with the shape of the upper surface of the rotational shaft 22.

Further, screw holes 213e for the screw engagement of the lower hub 213 with the upper surface of the rotational shaft 22 are formed through the lower hub 213. The screw holes 213e are formed through the lower hub 213, and a screw 215 is inserted into each of the screw holes 213e from the upper surface of the lower hub 213 and is coupled to the screw hole 222 formed on the upper surface of the rotational shaft 22 to secure the lower hub 213 to the rotational shaft 22. The screw holes 213e, 222 have sizes enough to fully receive the screw 215 therein when the screw 215 is engaged into the screw holes 213e, 222, so that there is less possibility that fixing the susceptor 2 by the lower hub 213 is hindered. Further, each of the screw holes 213e is preferably configured to have a step on which a head of the screw 215 can be engaged. Further, threads may be formed on both the screw hole 213e of the lower hub and the screw hole 222 of the rotational shaft 22, or may be formed only on the screw hole 222 of the rotational shaft 22, as shown in FIG. 6.

The spring 214 acts as an urging member that urges the stationary shaft 211 in a downward direction while urging the lower hub 213 in an upward direction. The spring 214 is supported on the spring support portion 211c of the stationary shaft 211 inserted into the spring 214. The spring 214 mounted on the stationary shaft 211 is received in the stationary shaft receiving region 221 formed on the upper surface of the rotational shaft 22. When the stationary shaft 211 is pulled up in this state, the spring 214 is contracted and generates an urging force in an extension direction. The generated urging force exerts an upward urging force on the lower surface of the lower hub 213 and a downward urging force on the support portion 211c of the stationary shaft 211. As a result, a force which raises the susceptor 2 is applied to the lower hub 213, and a downward pressing force is applied to the stationary shaft 211.

The stopper 216 is a member which is engaged with the constricted portion 211b of the stationary shaft 211 to secure the upper hub 212. As described above, since the spring 214 urges the stationary shaft 211 in the downward direction, a downward pressing force is applied to the stopper 216 engaged with the constricted portion 211b of the stationary shaft 211. Accordingly, the stopper 216 urges the upper hub 212 in the downward direction. In this way, the stopper 216 presses the upper hub 212 in cooperation with the spring 214 and secures the susceptor 2 through the upper hub 212 from an upper side of the susceptor 2. Further, since the spring 214 urges the lower hub 213 in the upward direction, a force of holding the susceptor 2 between the upper hub 212 and the lower hub 213 is generated, whereby the susceptor 2 can be secured. Further, strength of the spring 214 may be set to various values so long as the spring can stably secure the susceptor 2. For example, the spring 214 may have strength of 80 N to 150 N, and preferably 100 N to 120 N.

Here, as described above, the susceptor 2 is made of a material, for example quartz, carbon, SiC, and the like, which exhibits high resistance against a corrosive gas and high temperature. The upper hub 212 and the stopper 216 are placed above the susceptor 2, i.e., placed in a region to which a corrosive gas is supplied, like the susceptor 2 on which a substrate is loaded. Thus, the upper hub 212 and the stopper 216 are preferably made of corrosion resistant materials such as quartz, ceramics, Inconel (registered trade mark), stainless steel, and the like, which do not generate contamination or the like even when a corrosive gas is supplied at high temperature. For example, all of the susceptor 2, the upper hub 212 and the stopper 216 may be made of quartz.

On the other hand, although the corrosive gas is not directly supplied to a region below the susceptor 2, the region below the susceptor 2 may be maintained at higher temperature than a substrate processing region above the susceptor 2 since the heater part 7 is disposed in that region. Thus, in some embodiments, it is preferable to select a material showing high strength at high temperature as a material for components below the susceptor 2 rather than a material showing good suppression of contamination. Further, since the components below the susceptor 2 are rotated by the rotational shaft 22 and support the susceptor 2 from the lower side of the susceptor 2 against gravity, it is more desirable that these components have high machining precision.

Accordingly, from such a viewpoint, the lower hub 213, the spring 214, and the screws215 maybe made of metallic material such as a nickel-chromium-based alloy (i.e. INCONEL®(Registered trade mark)), stainless steel, nickel, and the like. These materials exhibit high strength at high temperature and high machining precision. On the other hand, there is a possibility that metal contamination occurs due to the metallic materials. However, since the lower hub 213, the spring 214, and the screws 215 are disposed in a region below the susceptor 2 in which no substrate processing is performed, there is a less possibility that the metal contamination occurs on the wall of the process chamber 1 and the like. In this way, by placing the components such as the spring 214 and the screws 215, which are preferably made of metal, below the susceptor 2, it is possible to obtain high machining precision and high strength at high temperature while reducing the influence of metal contamination on the substrate processing.

Further, provided that the portions shown in FIG. 6 are referred to as the susceptor securing structure and a structure including the driving part 23 supporting the rotational shaft 22 is referred to as a substrate loading unit, the susceptor securing structure and the substrate loading unit of the substrate processing apparatus according to this embodiment exclude the spring 214 and the screws 215 which may cause the meal contamination from a region above the susceptor 2. Generally, it is very difficult to realize a configuration in which components are fixed without using the screws 215. In this embodiment, however, such a difficult configuration to realize in the sense of mechanical engineering is realized by a pressing force via the stationary shaft 211 by the cooperation of the spring 214 disposed below the susceptor 2 and the stopper 216 disposed above the susceptor 2, and by the fastening by screw below the susceptor 2. As a result, it is possible to configure a substrate processing apparatus which can prevent metal contamination in the substrate processing region above the susceptor 2 while having high strength at high temperature and high machining precision.

Although it is conceivable to use a screw made of a corrosion resistant material such as quartz and the like for screw fastening in the substrate processing region above the susceptor 2, the corrosion resistant material such as quartz and the like is damaged and thus cannot function as a screw at high temperature due to its poor heat absorption capabilities. Accordingly, members such as screws and springs are preferably made of a metallic material having high heat absorption capabilities. In the substrate processing apparatus according to this embodiment, the screws 215 and the spring 214 are made of a metallic material to obtain sufficient heat absorption ability and are used outside the substrate processing region to significantly reduce the influence of metal contamination, thereby fulfilling two different requirements.

Further, the spring 214 and the screws 215 are preferably made of a metallic material having high heat absorption capability and high strength at high temperature. The lower hub 213 may be made of ceramic materials, quartz or the like, in addition to a nickel-chromium-based alloy (i.e. INCONEL®(Registered trade mark)), stainless steel, nickel described above. Since the lower hub 213 only functions as a member for securing the susceptor 2 and does not have functions such as screw fastening, generation of a pressing force, and the like, the lower hub may be made of various kinds of materials.

Figure 7:
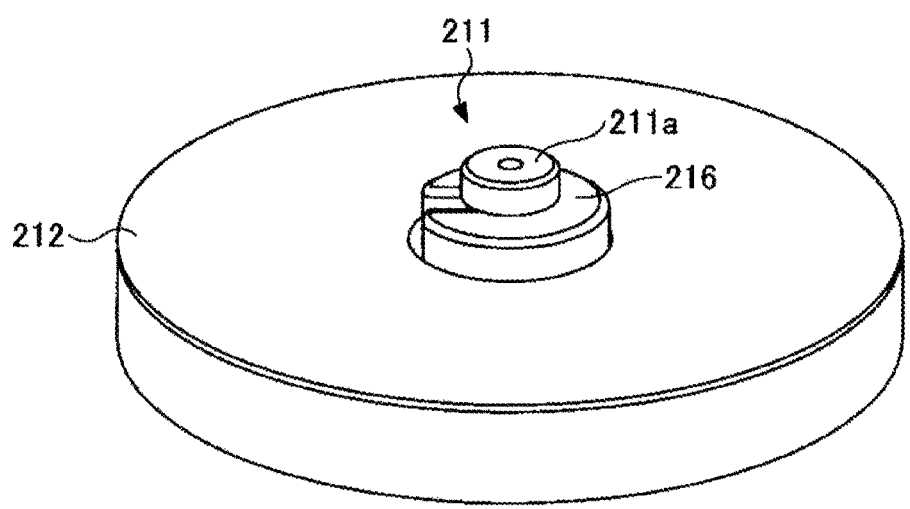
FIG. 7 is a perspective view of one example of a susceptor securing structure of the substrate processing apparatus according to the embodiment of the present disclosure.

FIG. 7 is a perspective view of one example of the susceptor securing structure of the substrate processing apparatus according to the embodiment of the present disclosure. As shown in FIG. 7, the stationary shaft 211 protrudes at the center of the upper hub 212, and the stopper 216 is engaged around the constricted portion 211b (not shown in FIG. 7, see FIG. 6) below the locking portion 211a, so that the upper hub 212 is urged from the upper side of the upper hub 212 and is secured. As shown, as the stopper 216, a C-ring having a C-shape is used. That is, a C-ring may be used as the stopper 216. In fabrication of the substrate loading unit, the stopper 216 can be easily installed.

Figure 8:
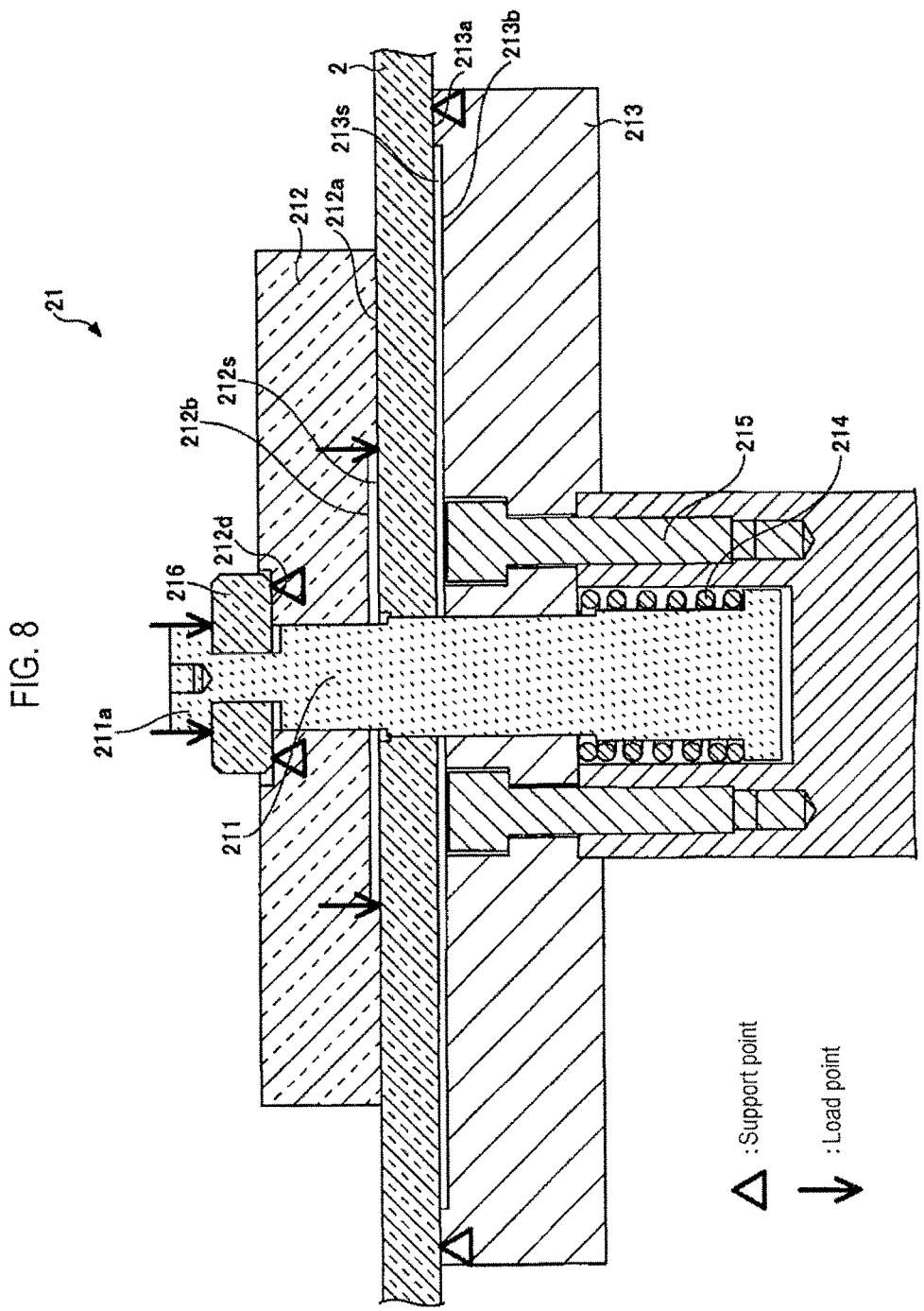
FIG. 8 is a cross-sectional view of the susceptor securing structure of the substrate processing apparatus according to the embodiment of the present disclosure, showing external forces applied to the susceptor securing structure.

FIG. 8 is a cross-sectional view of the susceptor securing structure of the substrate processing apparatus according to the embodiment of the present disclosure, showing external forces applied to the susceptor securing structure. As shown in FIG. 8, the susceptor 2 is supported on the contact portion 213a placed at the periphery of the lower hub 213, and the upper hub 212 supports the stopper 216 at a place contacting the stopper 216 positioned around the stationary shaft 211. That is, the members positioned higher have support points shifted more from the peripheral region toward the center.

Likewise, as for load points, first, load is applied from a lower surface of the locking portion 211a of the stationary shaft 211 to the upper surface of the stopper 216 around the stationary shaft 211. The load applied from the stopper 216 is transferred to the susceptor 2 through the contact portion 212a in a radially outward region of the upper hub 212. Even in this case, the members positioned lower have load points shifted more radially outward from the vicinity of the stationary shaft 211.

Further, for all of the load points on which the forces are exerted downwardly and the support points on which the forces are exerted upwardly, lower members have the force applying points shifted more radially outward from the center. As a result, the force applying points are most separated from each other at a lower side, and the distance between the force applying points is gradually narrowed along the upward direction, thereby enabling stable support of the susceptor 2 while easily keeping the susceptor 2 in the horizontal posture.

In this way, the substrate processing apparatus according to this embodiment has a configuration in which the susceptor 2 can be stably supported and secured.

Figure 9:
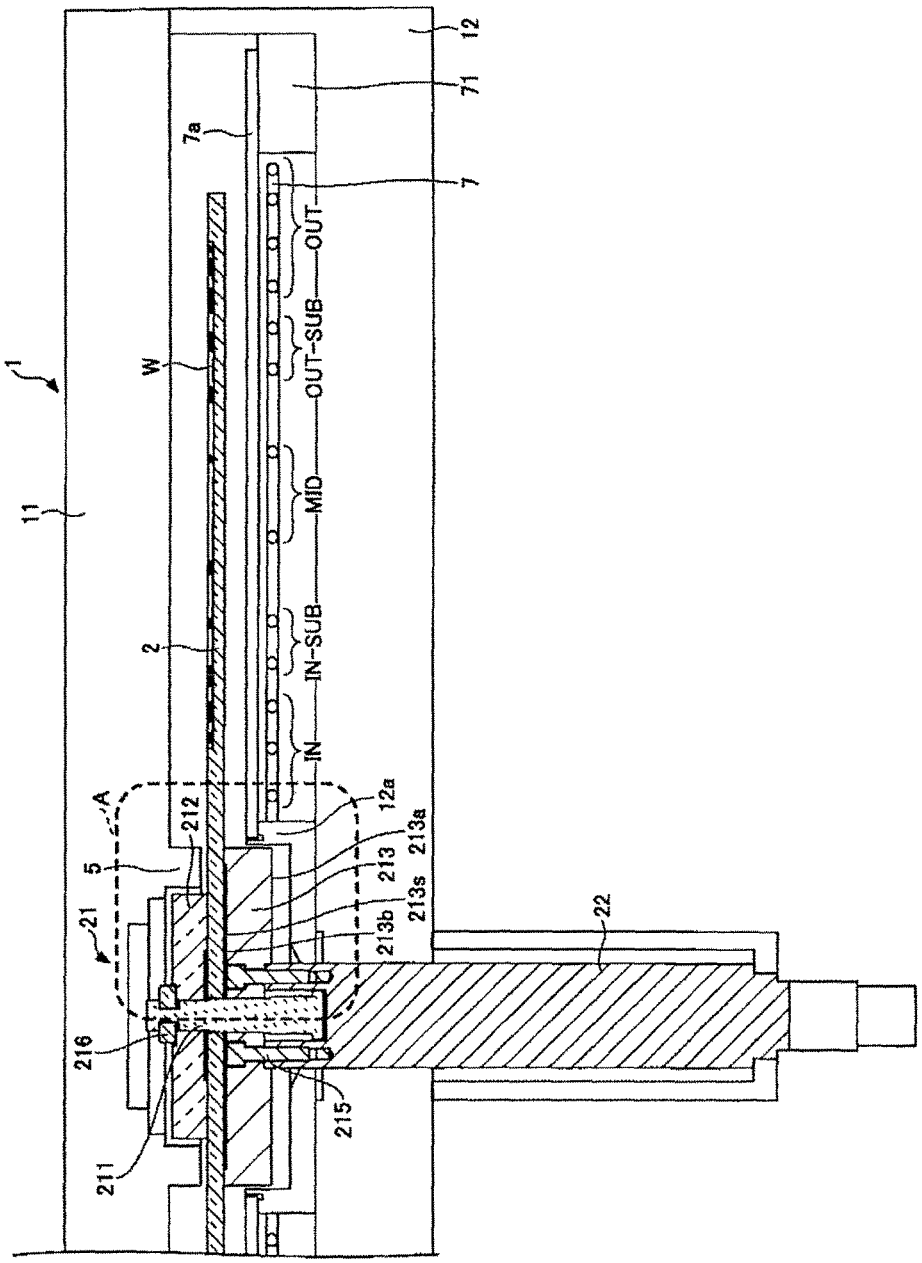
FIG. 9 is a cross-sectional view of a heat transfer countermeasure structure of a substrate loading unit of the substrate processing apparatus according to the embodiment of the present disclosure.

FIG. 9 is a cross-sectional view of a heat transfer countermeasure structure of the substrate loading unit of the substrate processing apparatus according to the embodiment of the present disclosure. In FIG. 9, components irrelevant to the heat transfer countermeasure structure are suitably omitted. Referring to FIG. 9, a wafer W is loaded on the susceptor 2, and the heater part 7 covered by the lid member 7a is placed below the susceptor 2. As shown in FIG. 9, the heater part 7 is disposed to cover the overall area of the wafer W in the radial direction. Since the heater part 7 is placed below the susceptor 2, heat is more easily transferred from the heater part 7 to the lower hub 213, the spring 214 and the screws 215 which are placed below the susceptor 2 than the upper hub 212 and the stopper 216 which are placed above the susceptor 2 in the susceptor securing structure. As described above, the lower hub 213 incudes the contact portion 213a, the non-contact portion 213b and the space 213s, wherein the non-contact portion 213b and the space 213s can suppress heat transfer from the susceptor 2 to the lower hub 213.

Figure 10:
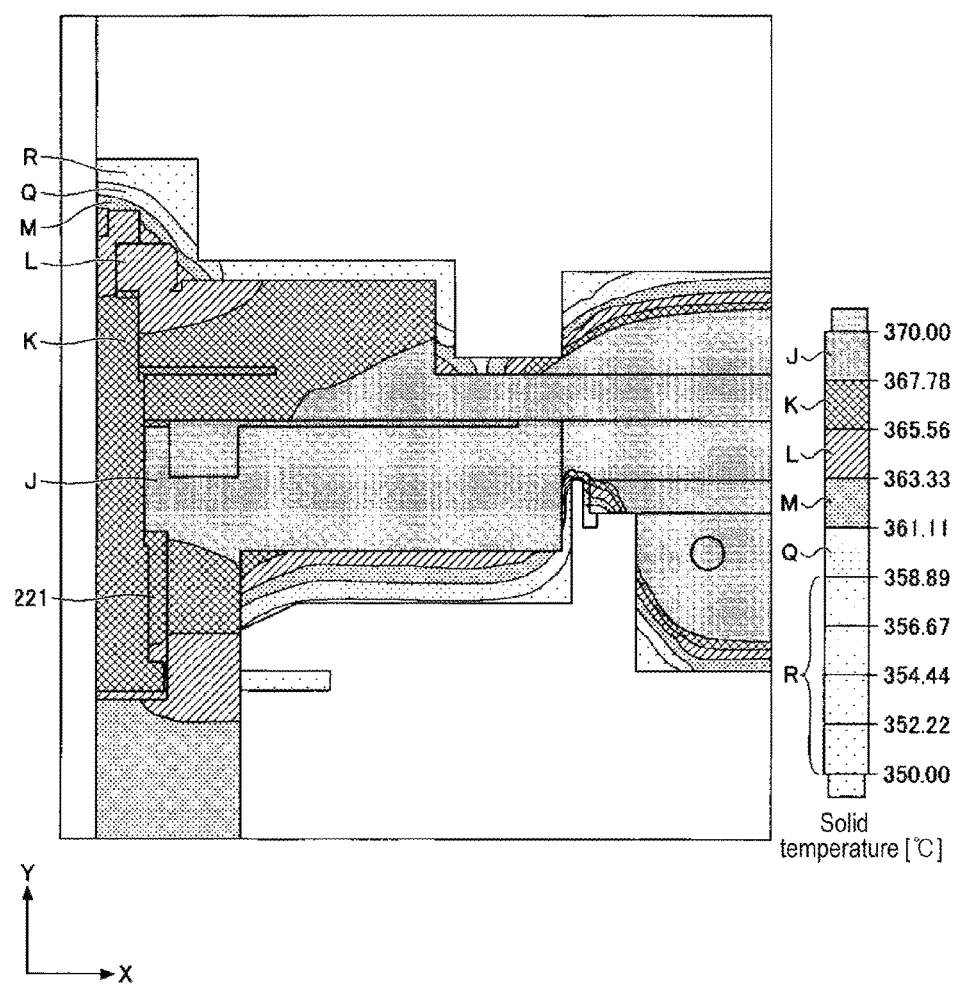
FIG. 10 is a view illustrating one example of temperature distribution by enlarging the region A in FIG. 9.

FIG. 10 is a view illustrating one example of temperature distribution by enlarging the region A in FIG. 9. Herein, the temperature distribution was obtained under conditions of a wafer temperature of 760 degrees C., a pressure of 6.7 Torr, and a chiller temperature of 85 degrees C.

In FIG. 10, region J indicates a region having a temperature of 367.78 degrees C. or more, region K indicates a region having a temperature of 365.56 degrees C. to 367.78 degrees C., region L indicates a region having a temperature of 363.33 degrees C. to 365.56 degrees C., and region M indicates a region having a temperature of 361.11 degrees C. to 363.33 degrees C. A region receiving the spring 214 in the stationary shaft receiving region 221 corresponds to region K or L and has a temperature of less than 380 degrees C. Here, the spring 214 has the working temperature range of 450 degrees C. or less, and the region receiving the spring 214 in the stationary shaft receiving region 221 has a temperature of less than 380 degrees C., thereby satisfying the temperature condition of the spring 214. Accordingly, the substrate processing apparatus according to the embodiment of the present disclosure enables the use of the spring 214 by effectively suppressing heat transfer to a region below the susceptor 2.

Figure 11B:
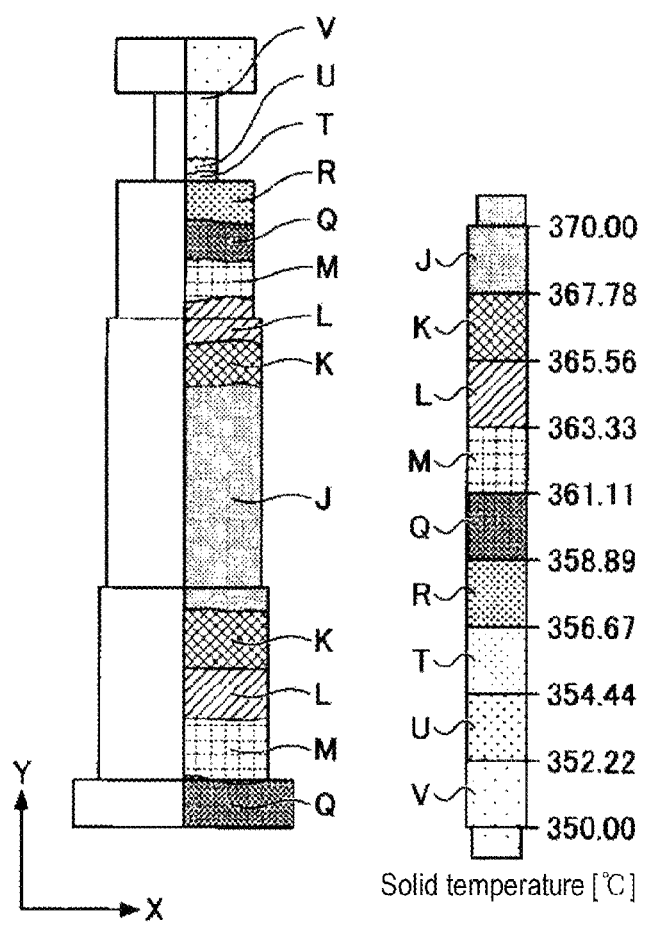
Figure 11C:
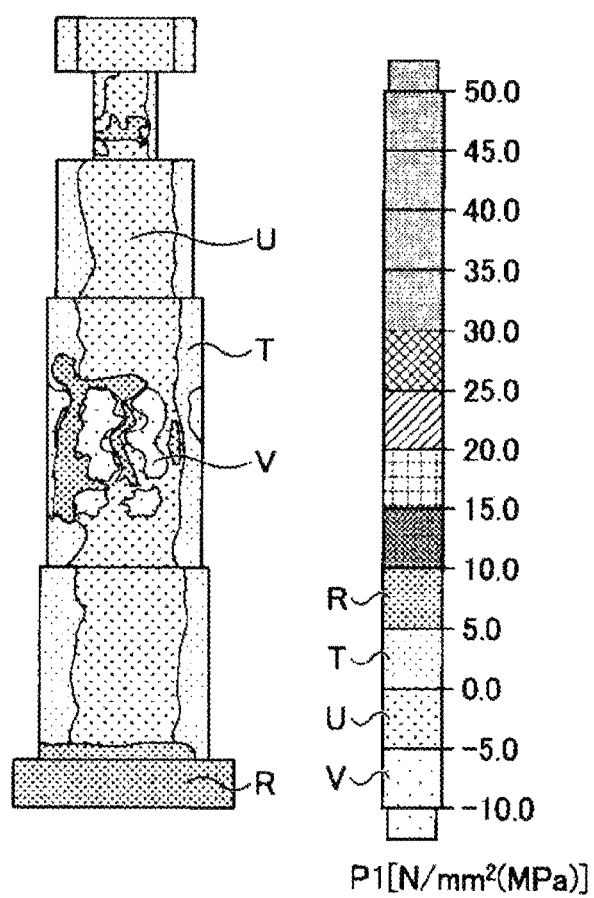

FIGS. 11A to 11C show temperature distribution and stress distribution of the stationary shaft 211 of the substrate processing apparatus according to the embodiment of the present disclosure. FIG. 11A is a cross-sectional view of the susceptor securing structure illustrating an arrangement of the stationary shaft 211 of the substrate processing apparatus, and FIG. 11B shows temperature distribution of the stationary shaft 211.

Referring to FIGS. 11A and 11B, it can be seen that a region slightly below the susceptor 2 shows the highest temperature and the temperature is gradually decreased as the vertical distance from the region having the highest temperature becomes larger. An upper end of the stationary shaft 211 above the susceptor 2 has a temperature of 352.22 degrees C. or less and thus has a sufficiently low temperature (region V). In the region below the susceptor 2, the lower end of the stationary shaft 211 has a temperature in the range of 358.89 degrees C. to 361.11 degrees C., and thus has a sufficiently low temperature. Accordingly, it can be seen that the heat transfer countermeasure structure is configured to block heat transfer to the rotational shaft 22 and the driving part 23 by sufficiently lowering the temperature in the stationary shaft 211 instead of transferring heat from the susceptor 2 to the rotational shaft 22 through the stationary shaft 211. In this way, the substrate processing apparatus according to the embodiment of the present disclosure can efficiently suppress heat transfer.

FIG. 11C shows stress distribution of the stationary shaft 211. According to the stress distribution of the stationary shaft, the lower end of the stationary shaft 211 has the highest stress of about 50 MPa. Accordingly, thermal impact did not occur. In this way, it can be seen that the substrate processing apparatus according to the embodiment of the present disclosure can sufficiently reduce stress applied to the stationary shaft 211.

Figure 12A:
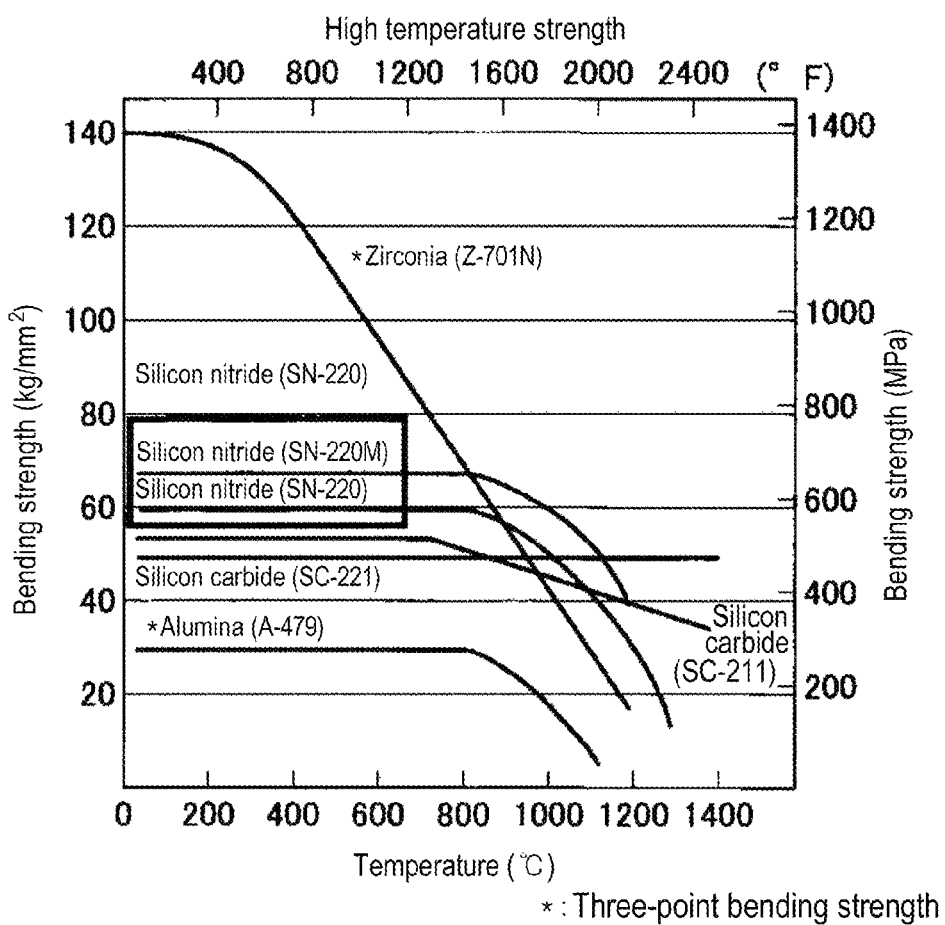
FIGS. 12A and 12B show graphs depicting high temperature strength and thermal shock resistance of silicon nitride applicable to a stationary shaft 211 of the substrate processing apparatus according to the embodiment of the present disclosure, compared with other materials.
Figure 12B:
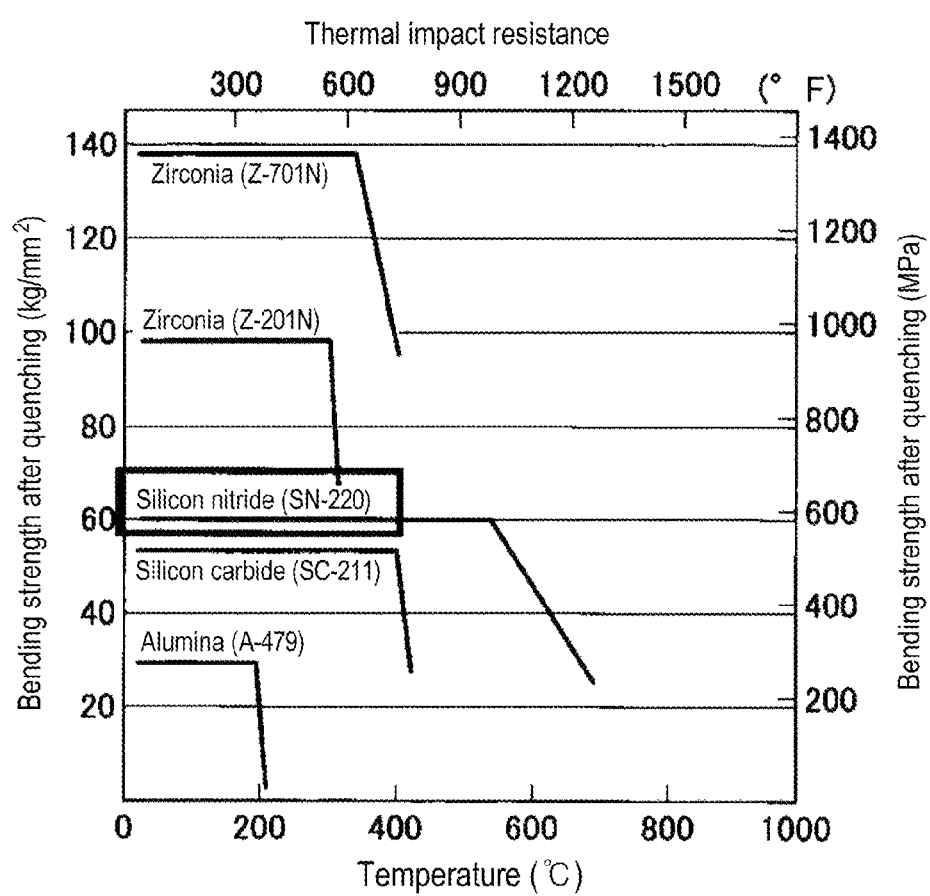

FIGS. 12A and 12B show graphs depicting the results obtained in comparison between high temperature strength and thermal shock resistance of silicon nitride applicable to the stationary shaft 211 of the substrate processing apparatus according to the embodiment of the present disclosure, and those of other materials. FIG. 12A is a graph depicting the results obtained in comparison between high temperature strength of silicon nitride and that of other materials and shows that silicon nitride has a sufficient and stable strength of about 70 kg/mm$^2$ at a temperature of 800 degrees C. or less. It can be seen that Zirconia has higher bending strength than silicon nitride. However, since the bending strength of zirconia varies depending on temperature, silicon nitride was superior to zirconia in terms of stable high temperature strength. As described above, it can be seen that silicon nitride has no problem in terms of high temperature strength as a material for the stationary shaft 211.

FIG. 12B is a graph depicting the results obtained in comparison between thermal shock resistance of silicon nitride and that of other materials. Herein, bending strength was measured as an index of thermal shock resistance by applying thermal impact to a test piece, wherein the test piece is first set to a temperature in the horizontal axis and is immersed into water (20 degrees C.). In FIG. 12B, at a temperature of less than 600 degrees C., bending strength after rapid cooling was about 60 kg/mm$^2$, thereby exhibiting stable thermal shock resistance. Zirconia had a higher bending strength after rapid cooling than silicon nitride. However, since the bending strength after rapid cooling of zirconia is sharply decreased at a temperature of 400 degrees C. or more, silicon nitride is superior to zirconia as a material for the stationary shaft 211, when considering a high temperature process. As described above, it can be seen that silicon nitride also has superior thermal shock resistance and is suitable for a material of the stationary shaft 211.

(Method of Fabricating Substrate Loading Unit)

Figure 13B:
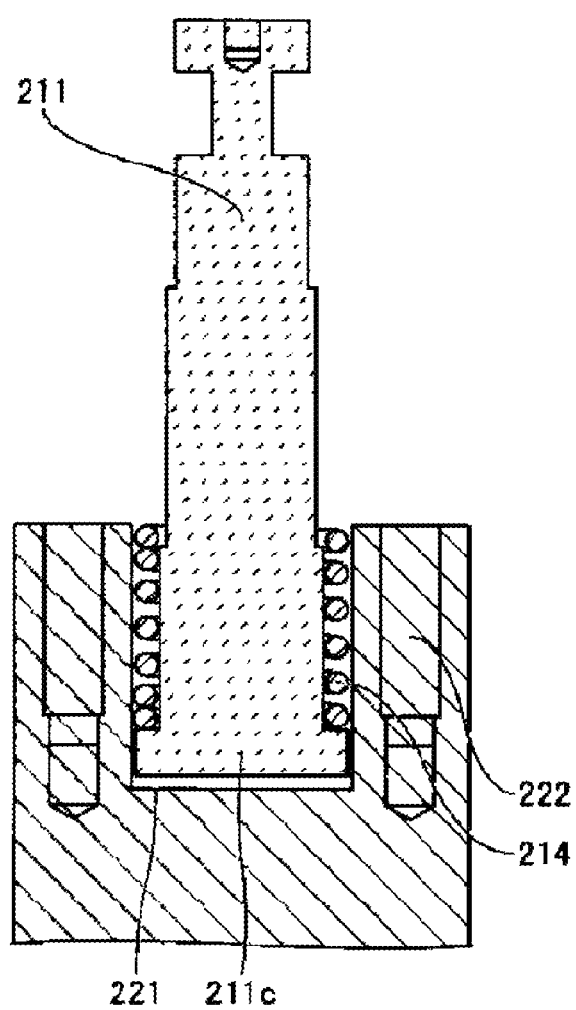

Next, referring to FIGS. 13A to 13C and FIGS. 14A to 14C, a method of fabricating a substrate loading unit according to one embodiment of the present disclosure will be described. FIGS. 13A to 13C show cross-sectional views illustrating a first half of a series of processes of the method of fabricating a substrate loading unit according to the embodiment of the present disclosure. In description of the method of fabricating a substrate loading unit according to the embodiment of the present disclosure, the same components as those described above will be indicated by the same reference numerals, and descriptions thereof will be omitted.

FIG. 13A shows one example of a spring mounting process. In the spring mounting process, the spring 214 is mounted on the stationary shaft 211. That is, the stationary shaft 211 is inserted into the spring 214. The spring 214 is supported by the spring support portion 211c at the lower end of the stationary shaft 211.

FIG. 13B shows one example of a stationary shaft insertion process. In the stationary shaft insertion process, the lower end of the stationary shaft 211 having the spring 214 mounted thereon is inserted into the stationary shaft receiving region 221 formed on the upper surface of the rotational shaft 22.

FIG. 13C shows one example of a lower hub installation process. In the lower hub installation process, the lower hub 213 is installed on the upper surface of the rotational shaft 22 using screws 215. Since the rotational shaft 22 has the screw holes 222 on the upper surface thereof and the lower hub 213 also has the screw holes 213e which are through-holes, the screws 215 are inserted into the screw holes 213e, 222 which are aligned with respect to each other. As a result, the lower hub 213 is secured to the upper surface of the rotational shaft 22 and the stationary shaft 211 is supported on the rotational shaft 22 via the lower hub 213. Further, the lower hub 213 has an engagement portion 213d which is engaged with the upper surface of the rotational shaft 22, when the lower hub 213 is secured to the rotational shaft 22.

Figure 14C:
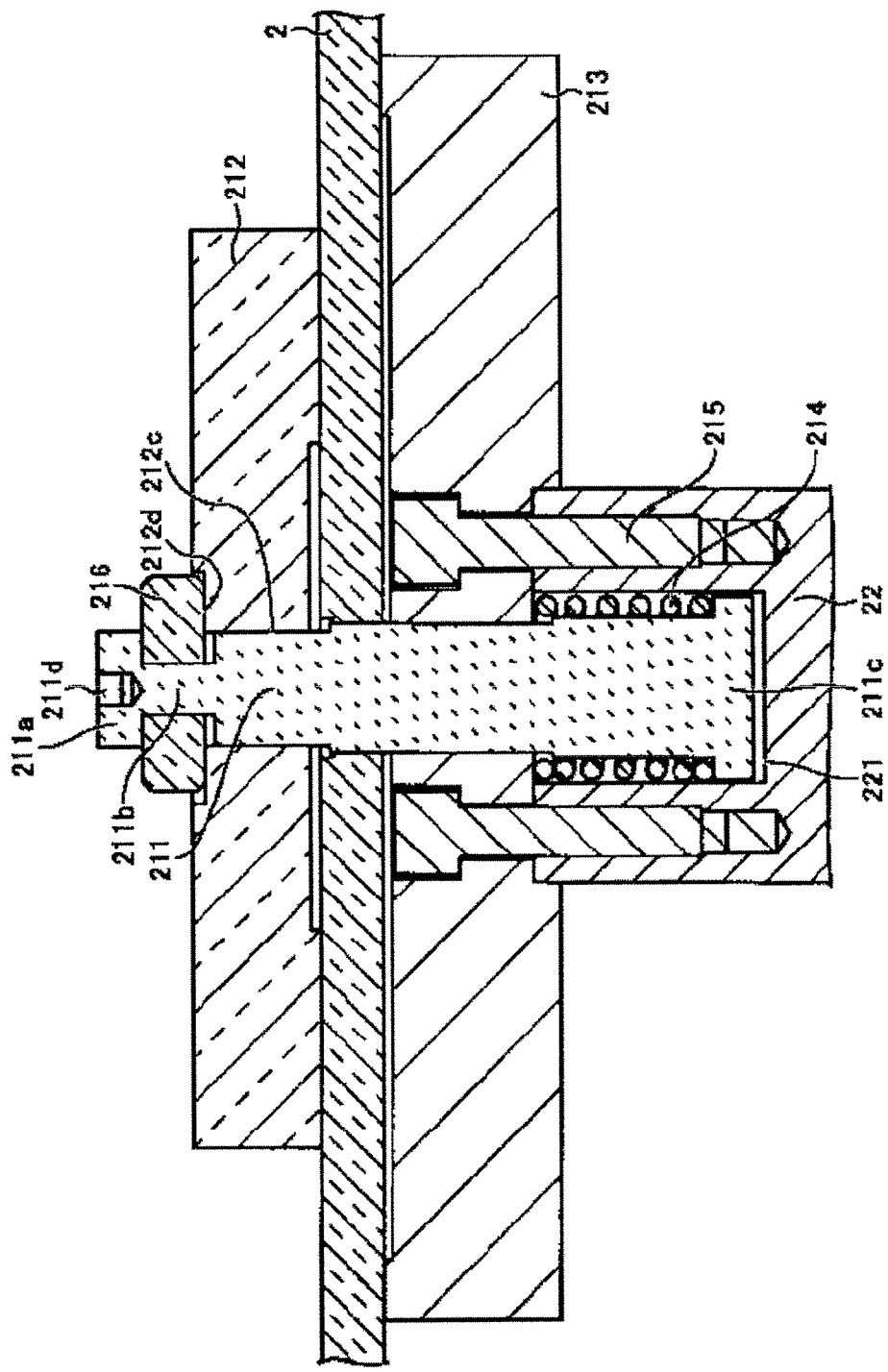

FIGS. 14A to 14C show cross-sectional views illustrating a second half of a series of processes of one example of the method of fabricating a substrate loading unit according to the embodiment of the present disclosure. FIG. 14A shows one example of a susceptor fitting process and an upper hub fitting process. In the susceptor fitting process, the susceptor 2 is placed on the lower hub 213 such that the stationary shaft 211 is fitted into the susceptor 2. Likewise, in the upper hub fitting process, the upper hub 212 is placed on the susceptor 2 such that the stationary shaft 211 is fitted into the upper hub 212. Further, as shown in FIG. 14A, the susceptor 2 and the upper hub 212 may be firstly overlapped with each other and brought on the lower hub 213 such that the stationary shaft 211 is fitted into the upper hub 212 and the susceptor 2 at the same time. In this case, the susceptor fitting process and the upper hub fitting process are performed at the same time.

FIG. 14B shows one example of a stationary shaft lifting process. In the stationary shaft lifting process, the stationary shaft 211 is lifted against the urging force of the spring 214 until the constricted portion 211b is positioned above an upper surface of the upper hub 212. The stationary shaft lifting process may be realized by various methods so long as the stationary shaft 211 can be lifted to the predetermined position described above. For example, the stationary shaft 211 may be lifted using a lift jig 80 as shown in FIG. 14B. When the stationary shaft 211 has a screw hole 211d formed on an upper surface thereof, a screw portion 81 disposed on a lower end of the lift jig 80 can be engaged with the screw hole 211d to be secured to the stationary shaft 211 and thus the stationary shaft 211 can be lifted by lifting the screw portion 81.

FIG. 14C shows one example of a stopper installation process. In the stopper installation process, the stopper 216 is engaged around the constricted portion 211b of the stationary shaft 211 to secure the stationary shaft 211. When the stopper 216 is a C-ring, an opening of the C-ring is horizontally moved to and engaged with the constricted portion 211b. With this configuration, the stopper 216 can be easily installed to the stationary shaft 211. The configuration of the stopper 216 is not limited to the C-ring structure, and may have any configuration enabling an engagement with the constricted portion 211b of the stationary shaft 211. Further, the configuration of the engagement between the stationary shaft 211 and the stopper 216 is not limited to the configuration in which the constricted portion 211b is formed around the stationary shaft 211, and various configurations are available as long as the leading end of the stationary shaft 211 and the stopper 216 can be engaged with each other. By installing the stopper 216 to the leading end of the stationary shaft 211, the downward urging force of the spring 214 is applied to the stopper 216 and the stopper 216 presses the upper hub 212. Further, the urging force of the spring 214 is also applied to the lower hub 213 in an upward direction, whereby the susceptor 2 is secured and supported while being interposed between the upper hub 212 and the lower hub 213. As a result, the substrate loading unit is fabricated.

In addition, although the film formation apparatus for forming a film by an ALD method has been illustrated as one example of the substrate processing apparatus in the embodiment of the present disclosure, the aforementioned susceptor securing structure can be applied to various substrate processing apparatuses in which a susceptor is provided and cleaning or etching using a corrosive gas is performed, such as a CVD (Chemical Vapor Deposition) apparatus, an etching apparatus, and the like.

Although the present disclosure has been described using the preferred embodiment, the present disclosure is not limited to the embodiment described above and various modification can be possible.

According to the present disclosure, it is possible to prevent occurrence of contamination even in high temperature processes.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosure.

What is claimed is:

1. A substrate processing apparatus comprising:
   a process chamber in which etching by a supplied corrosive gas can be performed to remove a film formed therein after a film formation process;
   a susceptor disposed in the process chamber and having a substrate loading portion on which a substrate can be loaded on an upper surface of the susceptor, the corrosive gas being supplied to the susceptor from above the upper surface of the susceptor;
   a shaft passing through the susceptor;
   a first securing member having a flat shape and configured to secure the susceptor at an upper surface side with the shaft inserted into the first securing member, the first securing member being in contact with the susceptor;
   a second securing member having a flat shape and configured to secure the susceptor at a lower surface side with the shaft inserted into the second securing member, the second securing member being in contact with the susceptor;
   a pressing member disposed below the susceptor to urge the shaft in a downward direction while urging the second securing member in an upward direction, thereby securing the susceptor at the lower surface side through the second securing member, an upper end of the pressing member being in contact with the second securing member and a lower end of the pressing member being in contact with a lower end of the shaft; and
   a stopping member formed above the susceptor and engaged with the shaft to urge the first securing member in cooperation with the pressing member, thereby securing the susceptor at the upper surface side through the first securing member,
   wherein the shaft has a constricted portion formed below an upper end of the shaft and having a smaller diameter than the upper end of the shaft, the stopping member being engaged with the constricted portion to stop a downward movement of the shaft, and
   wherein the susceptor, the first securing member and the stopping member are made of a material having corrosion resistance against the corrosive gas higher than the pressing member.

2. The substrate processing apparatus of claim 1, wherein the susceptor, the first securing member and the stopping member are made of a material having corrosion resistance against the corrosive gas higher than the second securing member.

3. The substrate processing apparatus of claim 1, wherein the second securing member and the pressing member are made of a material having heat resistance higher than the susceptor, the first securing member and the stopping member.

4. The substrate processing apparatus of claim 1, wherein the shaft comprises a pressing member support portion formed below the second securing member to support a lower side of the pressing member, and the pressing member is disposed between the pressing member support portion and the second securing member to urge the second securing member in the upward direction.

5. The substrate processing apparatus of claim 4, wherein the pressing member is a spring disposed around the shaft.

6. The substrate processing apparatus of claim 1, wherein the shaft includes a support shaft disposed below the susceptor to support the susceptor via the second securing member, the support shaft and the second securing member are secured to each other by a screw; and the susceptor, the first securing member and the stopping member are made of a material having corrosion resistance against the corrosive gas higher than the screw.

7. The substrate processing apparatus of claim 6, wherein the screw is made of a material having heat resistance higher than the susceptor, the first securing member and the stopping member.

8. The substrate processing apparatus of claim 6, wherein the support shaft has a space accommodating the pressing member together with a lower end of the shaft.

9. The substrate processing apparatus of claim 6, wherein the support shaft is a rotational shaft.

10. The substrate processing apparatus of claim 1, wherein the second securing member comprises a contact region contacting the susceptor in order to secure the susceptor, and a non-contact region not contacting the susceptor and defining a space between the non-contact region and the susceptor.

11. The substrate processing apparatus of claim 1, wherein the first securing member comprises a contact region contacting the susceptor in order to secure the susceptor, and a non-contact region not contacting the susceptor and defining a space between the non-contact region and the susceptor.

12. The substrate processing apparatus of claim 1, wherein the susceptor is made of quartz, carbon, or SiC.

13. The substrate processing apparatus of claim 1, wherein the first securing member and the stopping member are made of quartz, nickel-chromium-based alloy, stainless steel, or a ceramic material.

14. The substrate processing apparatus of claim 1, wherein the second securing member is made of quartz, nickel-chromium-based alloy, stainless steel, or a ceramic material.

15. The substrate processing apparatus of claim 1, wherein the stopping member is a C-ring engaged with the constricted portion.

16. The substrate processing apparatus of claim 1, wherein the first securing member and the second securing member have a circular disk shape and secure a central portion of the susceptor.

17. The substrate processing apparatus of claim 1, further comprising:
   a heater placed below the susceptor to heat the substrate.

* * * * *